United States Patent
Ausserlechner et al.

(10) Patent No.: US 9,523,720 B2
(45) Date of Patent: Dec. 20, 2016

(54) MULTIPLE CURRENT SENSOR DEVICE, A MULTIPLE CURRENT SHUNT DEVICE AND A METHOD FOR PROVIDING A SENSOR SIGNAL

(71) Applicant: Infineon Technologies AG, Neubiberg (DE)

(72) Inventors: Udo Ausserlechner, Villach (AT); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 718 days.

(21) Appl. No.: 13/832,277

(22) Filed: Mar. 15, 2013

(65) Prior Publication Data

US 2014/0266269 A1    Sep. 18, 2014

(51) Int. Cl.
*G01R 27/08* (2006.01)
*G01R 19/00* (2006.01)
(Continued)

(52) U.S. Cl.
CPC .............. *G01R 19/00* (2013.01); *G01R 1/203* (2013.01); *G01R 19/0092* (2013.01); *H02M 2001/0009* (2013.01)

(58) Field of Classification Search
CPC ......... G01R 27/08; G01R 19/00; G01R 1/203; G01R 19/0092; H02M 2001/0009
(Continued)

(56) References Cited

U.S. PATENT DOCUMENTS 3,778,583 A * 12/1973 Becker ................. B23K 11/163
                                                       219/91.21
3,897,593 A *  7/1975 Becker ................. B23K 11/163
                                                       219/92
(Continued)

FOREIGN PATENT DOCUMENTS

| DE | 103 33 089 A1 | 3/2005 |
| EP | 1113277 A1 | 7/2001 |
| WO | 0123899 A1 | 4/2001 |

OTHER PUBLICATIONS

Fink et al., "Temperature-resistance Coefficients for Aluminum and Copper", Standard Handbook for Electrical Engineers, 1969, p. 4-11.*

(Continued)

*Primary Examiner* — Jermele M Hollington
*Assistant Examiner* — Lamarr Brown
(74) *Attorney, Agent, or Firm* — Eschweiler & Associates, LLC

(57) ABSTRACT

A multiple current sensor device or a multiple current shunt device includes at least two resistive sections comprising a first resistive section and a second resistive section, at least two connecting sections comprising a first connecting section and a second connecting section and a common connecting section. The first resistive section is electrically coupled in between the first connecting section and the common connecting section. The second resistive section is electrically coupled in between the second connecting section and the common connecting section. Using an embodiment may improve a trade-off between an efficient integration, a compact integration, a compact implementation and an accurate determination of at least one value indicative of at least one of multiple currents.

22 Claims, 17 Drawing Sheets

(51) Int. Cl.
*G01R 1/20* (2006.01)
*H02M 1/00* (2006.01)

(58) Field of Classification Search
USPC ............... 324/713, 522, 691–724, 117 R
See application file for complete search history.

(56) References Cited

U.S. PATENT DOCUMENTS

| | | | | |
|---|---|---|---|---|
| 4,258,570 | A * | 3/1981 | Weiler | 374/152 |
| 4,494,068 | A * | 1/1985 | Ley et al. | 324/126 |
| 4,651,024 | A * | 3/1987 | Hickey | 307/147 |
| 5,074,152 | A | 12/1991 | Ellner et al. | |
| 5,450,755 | A | 9/1995 | Saito | |
| 5,604,477 | A | 2/1997 | Rainer et al. | 338/293 |
| 5,804,979 | A * | 9/1998 | Lund | G01R 1/203 |
| | | | | 324/126 |
| 6,225,684 | B1 * | 5/2001 | Stitt et al. | 257/666 |
| 6,489,693 | B1 * | 12/2002 | Hetzler | 307/10.1 |
| 6,988,414 | B2 | 1/2006 | Ruhrig et al. | |
| 6,995,960 | B2 * | 2/2006 | Seyama | B82Y 10/00 |
| | | | | 360/324.11 |
| 7,170,295 | B2 * | 1/2007 | Hetzler | 324/522 |
| 7,277,006 | B2 | 10/2007 | Yokoo | |
| 7,391,091 | B2 * | 6/2008 | Tondra | G01R 33/1276 |
| | | | | 257/427 |
| 7,474,093 | B2 | 1/2009 | Ausserlechner | |
| 8,283,742 | B2 * | 10/2012 | Motz | G01R 15/202 |
| | | | | 257/427 |
| 8,461,824 | B2 * | 6/2013 | Ausserlechner | 324/126 |
| 8,760,149 | B2 * | 6/2014 | Ausserlechner | 324/117 H |
| 8,878,520 | B2 * | 11/2014 | Tamura | 324/117 R |
| 8,947,097 | B2 * | 2/2015 | Muller | 324/416 |
| 8,963,536 | B2 * | 2/2015 | Ausserlechner | G01R 33/072 |
| | | | | 324/117 R |
| 8,975,889 | B2 * | 3/2015 | Ausserlechner | G01R 15/202 |
| | | | | 324/117 H |
| 9,222,992 | B2 * | 12/2015 | Ausserlechner | G01R 33/075 |
| 2002/0034055 | A1 | 3/2002 | Seyama et al. | |
| 2004/0263150 | A1 * | 12/2004 | Hetzler | 324/126 |
| 2005/0270714 | A1 * | 12/2005 | Huang et al. | 361/91.1 |
| 2006/0081954 | A1 | 4/2006 | Tondra et al. | |
| 2006/0158176 | A1 * | 7/2006 | Preusse et al. | 324/117 R |
| 2006/0219436 | A1 | 10/2006 | Taylor et al. | |
| 2008/0246462 | A1 * | 10/2008 | Muller | 324/105 |
| 2008/0297138 | A1 * | 12/2008 | Taylor et al. | 324/117 H |
| 2010/0103571 | A1 * | 4/2010 | Brown et al. | 361/56 |
| 2010/0156394 | A1 | 6/2010 | Ausserlechner et al. | |
| 2010/0157492 | A1 * | 6/2010 | Tan | 361/56 |
| 2010/0327873 | A1 * | 12/2010 | Dorf et al. | 324/464 |
| 2011/0267038 | A1 * | 11/2011 | Homma | G01R 1/203 |
| | | | | 324/126 |
| 2012/0086430 | A1 * | 4/2012 | Marten | G01R 19/0092 |
| | | | | 324/76.11 |
| 2012/0126805 | A1 | 5/2012 | Ausserlechner | |
| 2012/0167026 | A1 * | 6/2012 | Hickam | 716/110 |
| 2013/0181807 | A1 * | 7/2013 | Hetzler | G01R 1/203 |
| | | | | 338/7 |
| 2013/0328547 | A1 * | 12/2013 | Marten | 324/126 |
| 2014/0159734 | A1 * | 6/2014 | Knill | G01R 31/3606 |
| | | | | 324/426 |
| 2015/0001965 | A1 * | 1/2015 | Angeli | G01R 19/00 |
| | | | | 307/117 |

OTHER PUBLICATIONS

Data Sheets, Manganin, http://www.isabellenhuette.de/uploads/media/MANGANIN_02.pdf, Issue Mar. 29, 2014, p. 1-4.*

* cited by examiner

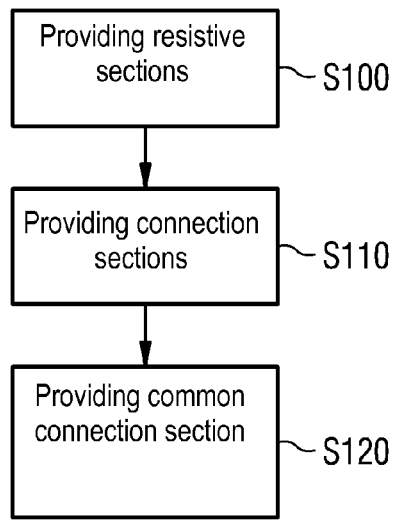
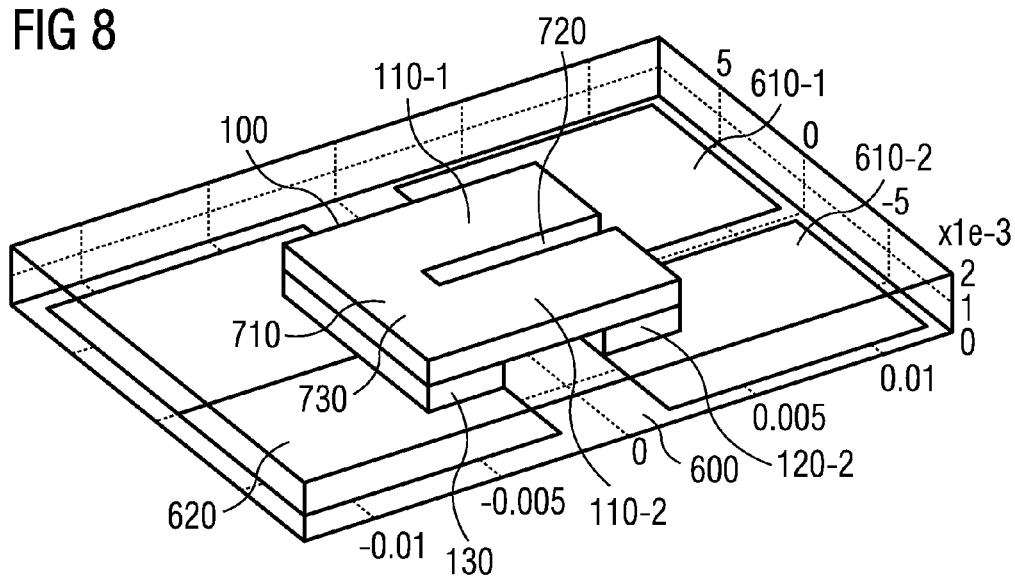

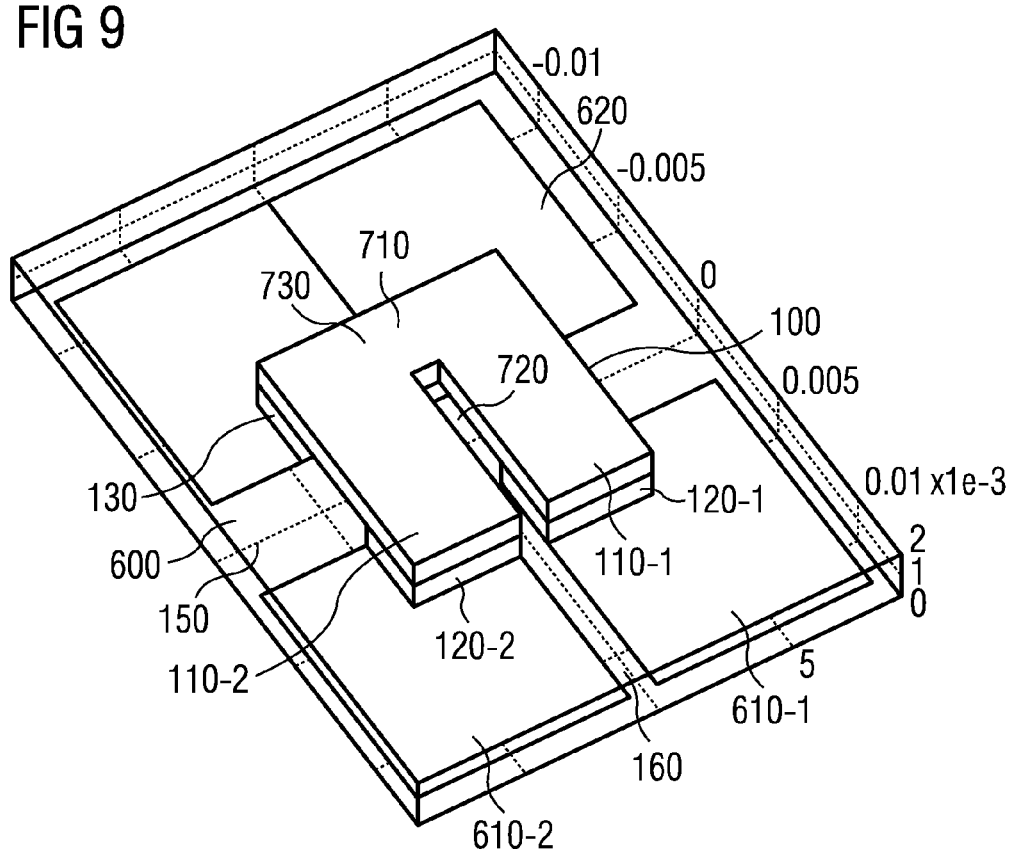

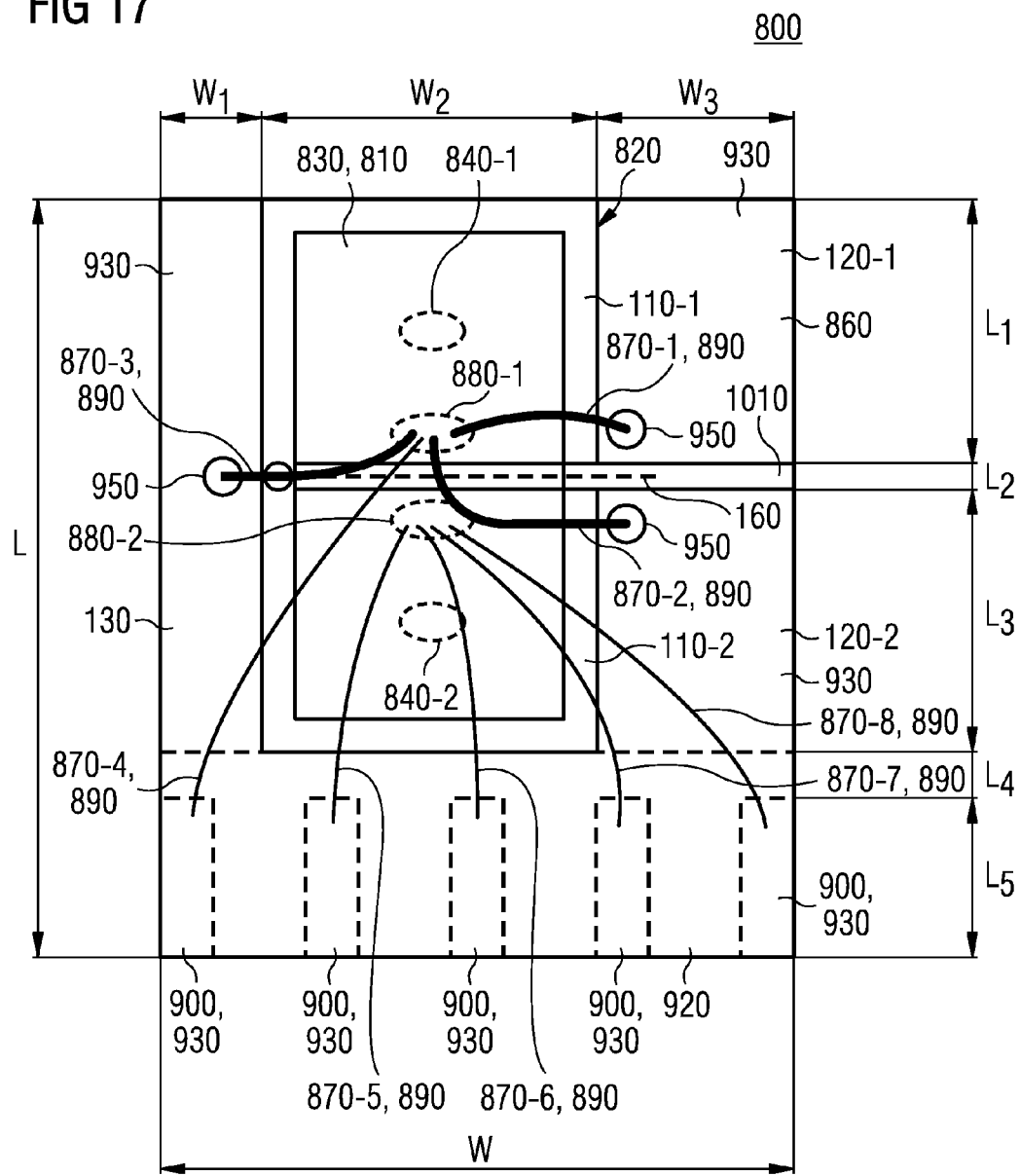

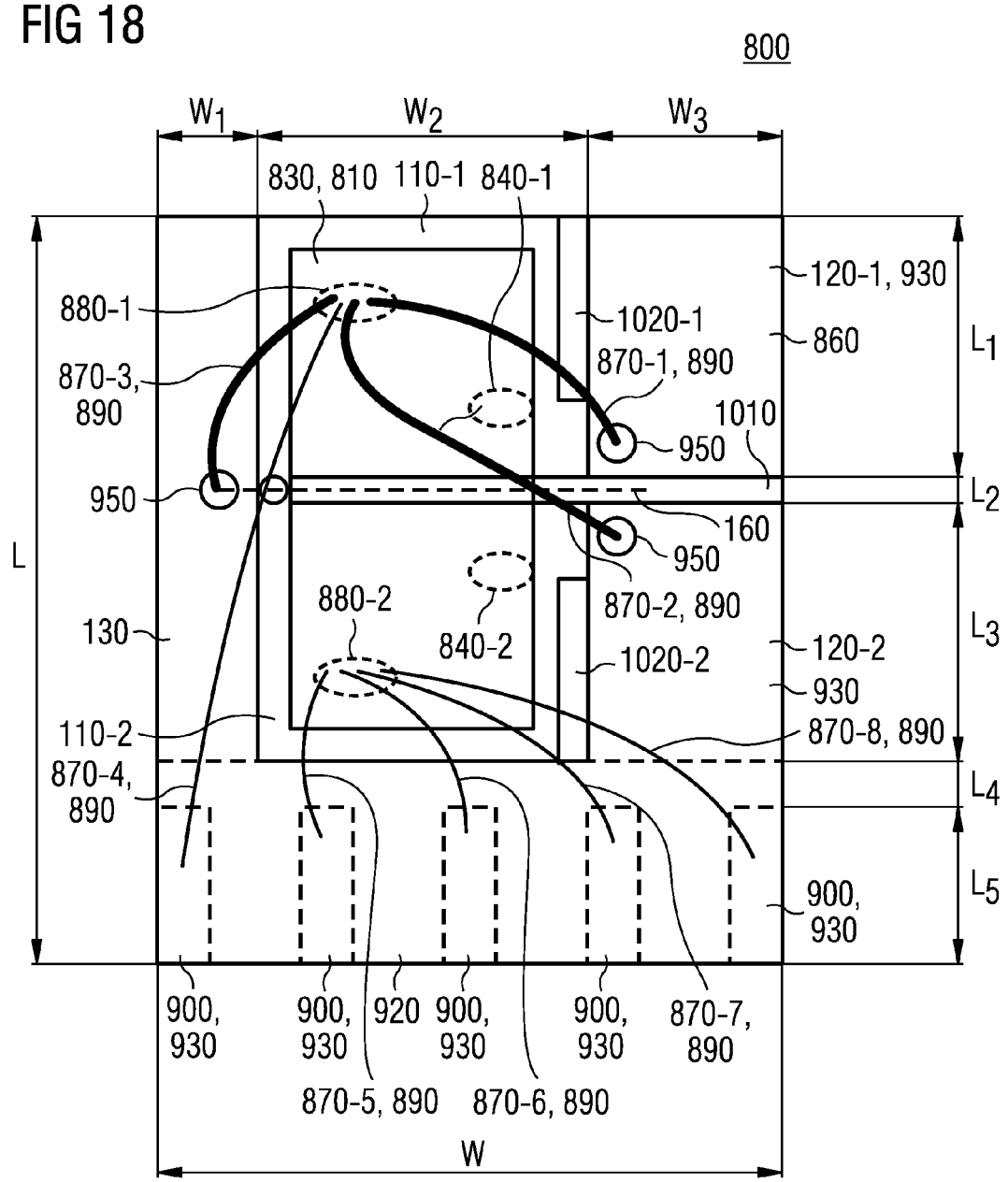

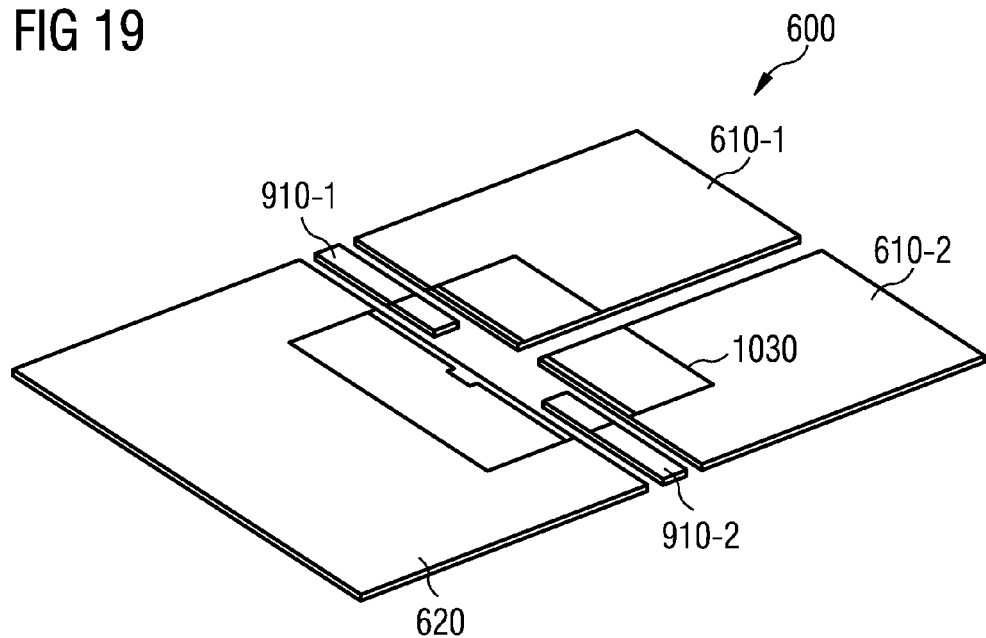
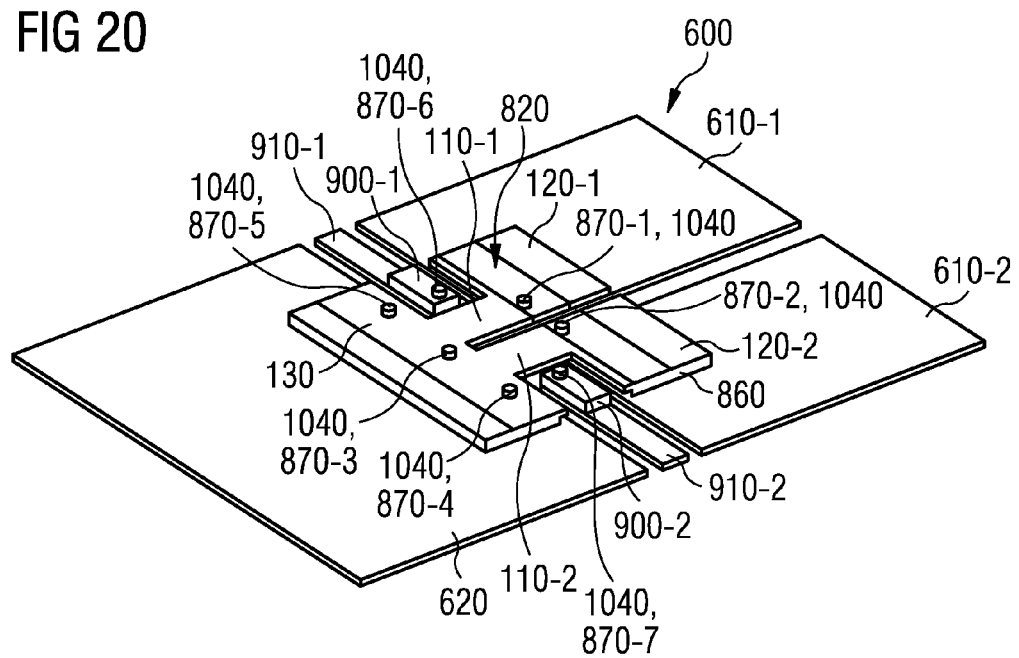

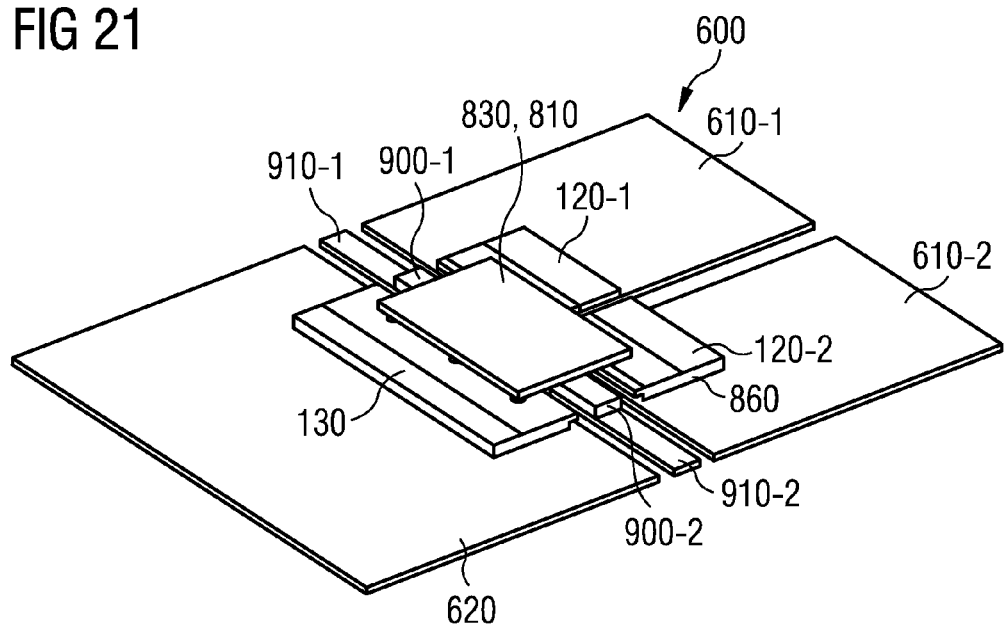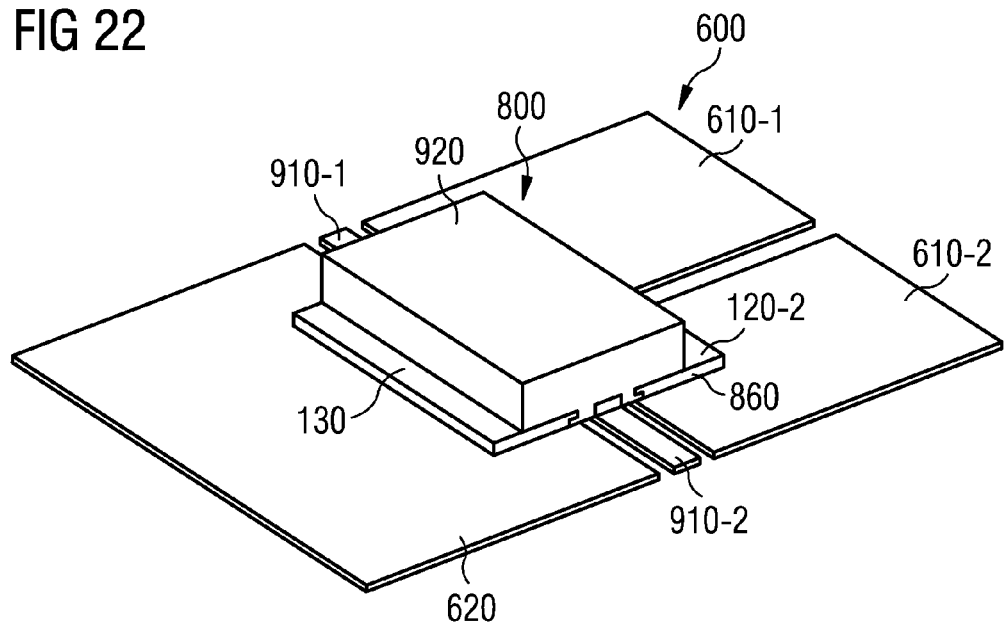

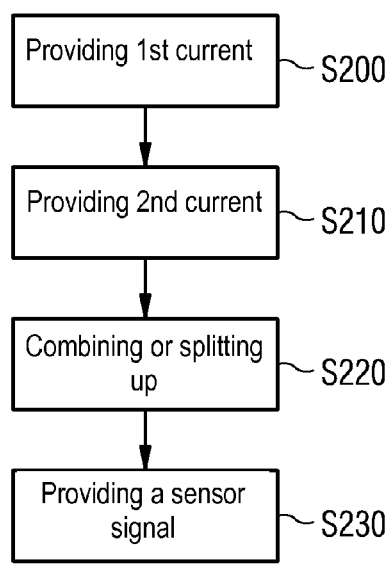
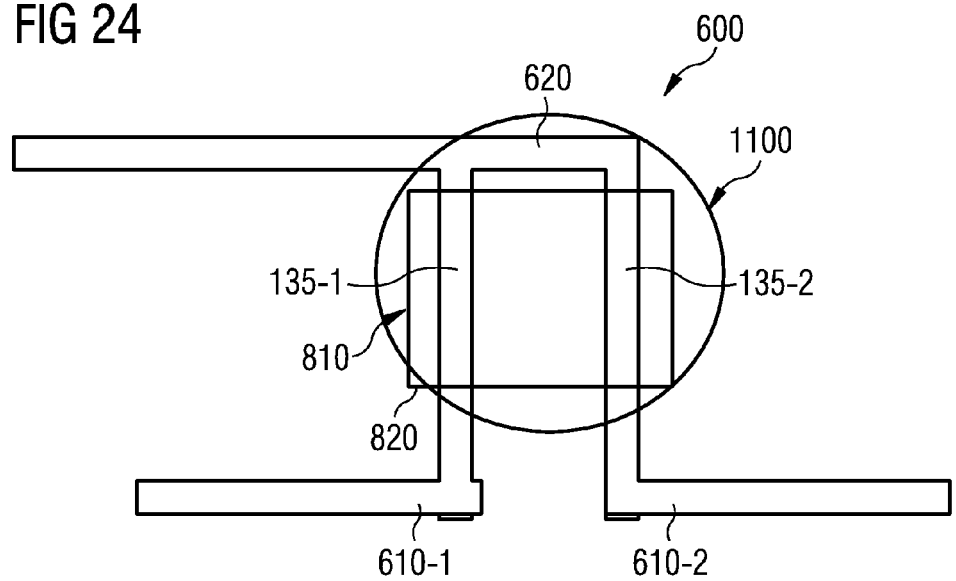

US 9,523,720 B2

MULTIPLE CURRENT SENSOR DEVICE, A MULTIPLE CURRENT SHUNT DEVICE AND A METHOD FOR PROVIDING A SENSOR SIGNAL

TECHNICAL FIELD

Embodiments relate to a multiple current sensor device, a multiple current shunt device, a printed circuit board and a method for providing a multiple current shunt device or a multiple current sensor device.

BACKGROUND

In many fields of application, multiple currents may have to be determined for different reasons. For instance, determining multiple currents in a circuitry may be advisable or even necessary to ensure the proper operation of the respective circuitry, a corresponding device comprising or associated with the circuitry or a corresponding system. For instance, at least one of the multiple currents to be determined may be used in the framework of controlling the respective current, for instance, in a closed-feedback loop. Examples come, for instance, from the field of speed and torque control of brushless direct current (BLCD) motors, where at least two of three currents through an inverter circuit are typically measured. To this end not only the absolute accuracy of currents may be vital, but also a ratio of the currents may have to be measured with certain accuracy.

However, also other reasons for determining multiple currents exist. For instance, it may be advisable to determine at least one of the multiple currents for safety reasons, to prevent the associated circuitry, the corresponding device or system from damage. The same may also apply to prevent damages from further components or systems covered to the respective circuitry. By determining one or more currents, it may also be possible to prevent damages from other goods, users, service personnel or other human beings.

However, many applications and implementations may be subject to technical, economic, fabrication-related and other boundary conditions. For instance, the available space on a printed circuit board or another carrier may be limited, favoring a more compact implementation or integration. Naturally, also economic boundary conditions may favor a more cost-efficient implementation. However, it might be desirable to ensure a certain degree of accuracy in determining the at least one current.

Determining one or multiple currents may, for instance, be based on measuring at least one voltage drop of the multiple currents across a resistance. Based on the determined voltage drop at least one current value may then be determined, for instance, based on Ohm's law.

Therefore, a demand exists to improve a trade-off between an efficient integration, a compact integration, a compact implementation and an accurate determination of at least one value indicative of at least one of the multiple currents.

SUMMARY

A discrete multiple current sensor device according to an embodiment comprises an evaluation circuit and at least a first current rail and a second current rail. The first current rail and the second current rail comprise a common connecting section. The first current rail further comprises a first resistive section and a first connecting section such that the first resistive section is electrically coupled in between the first connecting section and the common connecting section. The second current rail further comprises a second resistive section and a second connecting section such that the second resistive section is electrically coupled in between the second connecting section and the common connecting section. The evaluation circuit is configured to determine at least one voltage drop across one of the at least two resistive sections and to provide a sensor signal indicative of at least one current value of a current flowing through the respective resistive section based on the at least one determined voltage drop.

Embodiments are based on the finding that a trade-off between an efficient integration, a compact integration, a compact implementation and an accurate determination of at least one value indicative of at least one of the multiple currents may be achievable by using a multiple current sensor device according to an embodiment. For instance, by integrating two resistive sections into a single device, it may be possible to determine multiple currents provided to the sensor device or values indicative thereof in the same device. Furthermore, by connecting the two resistive sections to a common connecting section, a size of the device may be reducible. A number of electrical connections and, as a consequence, of signal lines on a carrier such as a printed circuit board (PCB) may be reduced. Moreover, by implementing an evaluation circuit, a multiple current sensor device may offer the possibility of directly processing the at least one voltage drop determined. All, some or one of these factors may contribute to an improvement of the aforementioned trade-off.

A multiple shunt device according to an embodiment comprises at least two resistive sections comprising a first resistive section and a second resistive section, at least two connecting sections comprising a first connecting section and a second connecting section and a common connecting section. The first resistive section is electrically coupled in between the first connecting section and the common connecting section. Likewise, the second resistive section is electrically coupled in between the second connecting section and the common connecting section. At least one of the at least two resistive sections comprises a material with a smaller variation of the electrical resistivity with temperature and a higher electrical resistivity than a material of at least one of the at least two connecting sections and the common connecting section.

Embodiments are based on the finding that a trade-off between an efficient integration, a compact integration, a compact implementation and an accurate determination of at least one value indicative of at least one of the multiple currents may be realized by employing a multiple current shunt device according to an embodiment. For instance, by employing at least two resistive sections and at least two connecting sections electrically coupled to the resistive sections, it may be possible to provide multiple currents to the same multiple current shunt device. By employing a common connecting section, it may be possible to reduce a size of the multiple current shunt device and to simplify its integration into a circuitry. Furthermore, by using a material with a smaller variation of the electrical resistivity with temperature but a higher electrical resistivity than the material of at least one of the connecting sections, a more accurate determination may be achievable over a larger temperature range, which may also be influenced by the currents to be determined themselves.

A method for providing a sensor signal according to an embodiment comprises providing a first current comprising a magnitude corresponding to a first part of a combined current to a discrete sensor device, providing a second current comprising a magnitude corresponding to a second part of the combined current to the discrete sensor device, combining the first current and the second current to form the combined current or splitting up combined current into the first current and the second current, and providing a sensor signal comprising information concerning the magnitudes of the first current and of the second current.

An embodiment of a method for providing a sensor signal is based on the finding that the aforementioned trade-off may be improved by providing the first and second currents to the same sensor device. This may, for instance, improve an accuracy of the measurement.

BRIEF DESCRIPTION OF THE DRAWINGS

Several embodiments of the present invention will be described in the enclosed Figures.

FIG. 7 shows a flow chart of a method for providing a multiple current shunt device or a multiple current sensor device according to an embodiment.

FIG. 8 shows a perspective view of a further multiple current shunt device according to an embodiment.

FIG. 9 shows another perspective view of the multiple current shunt device according to an embodiment shown in FIG. 8.

FIG. 17 shows a plan view of a multiple current sensor device according to an embodiment.

FIG. 18 shows a plan view of a multiple current sensor device according to an embodiment.

FIG. 19 shows a layout of signal lines on a printed circuit board for a multiple current sensor device according to an embodiment.

FIG. 20 shows a perspective view of the signal lines of the printed circuit board of FIG. 19 along with a leadframe of a multiple current sensor device according to an embodiment.

FIG. 21 shows a perspective view of the signal lines of the printed circuit board and the leadframe of FIG. 20 along with a die of an evaluation circuit mounted to the leadframe using a flip-chip style of the multi-current sensor device according to an embodiment.

FIG. 22 shows a perspective view of the traces of the printed circuit board and the leadframe of FIG. 21 and a mold compound of the packaged die of the evaluation circuit of the multiple current sensor device according to an embodiment.

FIG. 23 shows a flow chart of a method for providing a sensor signal according to an embodiment.

FIG. 24 shows a plan view of an arrangement, that may be used to implement an embodiment of the method for providing a sensor signal.

DETAILED DESCRIPTION

In the following, embodiments will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least one, some or all of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

In many fields of applications and implementations, multiple currents are to be determined for different reasons. For instance, it might be advisable to monitor multiple currents of a circuitry, a device or a system, for instance, to allow the circuitry to control the respective currents, for instance, by employing a closed-feedback loop. The same may also apply to facilitate a safety function, for instance, to prevent damages to or destruction of the respective circuitry, device or system. It may also be advisable to determine multiple currents to prevent users, maintenance personnel or other human beings from harm by a malfunction of the respective circuitry, device or system.

To determine a current, several approaches may be taken. For instance, a voltage drop across a resistor, a resistive element, a resistive section or the like can be determined on the basis of which using Ohm's law the current flowing through the resistor can be calculated provided the resistance of the resistor is known, can be determined or can be estimated. The current I flowing through the resistor is then equal to the voltage drop V divided by the resistance R of the resistor ($I=V/R$). As will be outlined below, embodiments of a multiple current shunt device as well as embodiments of a multiple current sensor device are based on this mode of operation.

Figure 1:
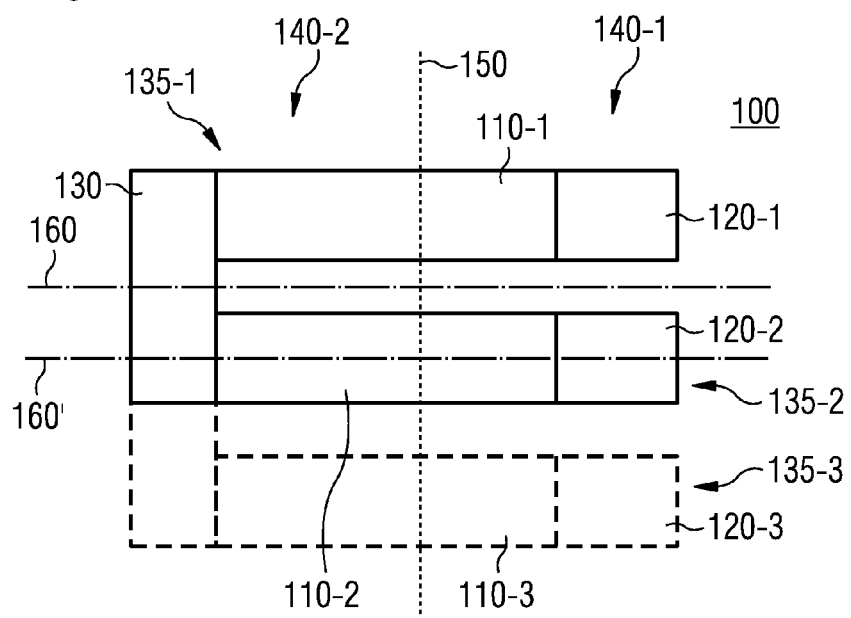
FIG. 1 shows a schematic plan view of a multiple current shunt device according to an embodiment.

FIG. 1 shows a schematic plan view of two different multiple current shunt devices 100 according to embodiments. The multiple current shunt devices 100 are implemented as discrete devices. A discrete device may be a device allowing a simultaneous handling of all components at the same time. Moreover, it may—in terms of its inner structure—have a well-defined arrangement and/or well-defined thermal and inductive properties. In other words, a discrete device may represent a fixed arrangement of structures and properties after a calibration process. After the calibration process, the calibrated device may operate within specified tolerance limits.

To be more precise, FIG. 1 shows by solid lines a first embodiment of a multiple current shunt device 100 comprising two resistive sections 110, two connecting sections 120 and a common connecting section 130, while a second embodiment of a multiple current shunt device 100 shown by the solid lines and the dashed lines in FIG. 1 comprises three resistive sections 110, three connecting sections 120 and the common connecting section 130. The resistive sections 110 along with the connecting sections 120 and the common connecting section 130 form current rails 135, which are also referred to as current paths. A first current rail 135-1 of the current rails comprises a first resistive section 110-1, a first connecting section 120-1 and the common connecting section 130. Accordingly, the second current rail 135-1 of the current rails comprises a second resistive section 110-1, a second connecting section 120-1 and the common connecting section 130. The connecting sections 120 and the common connecting section are configured to allow the multiple current shunt device 100 to be electrically coupled to an outside circuit.

The resistive sections 110 are configured to comprise a higher electrical resistance than the connecting sections 120 and the common connecting section 130. Consequently, a power dissipation in the resistive sections 110 is higher than in the connecting sections 120 and the common connecting section 130, when a current flows through the respective current rail 135.

The multiple current shunt device 100 according to an embodiment is capable of being provided with multiple currents as outlined before. To enable this, the multiple current shunt device 100 comprises the at least two resistive sections 110, which serve as resistive elements or resistors over which the multiple elements create a measurable voltage drop. To provide one of the multiple currents to each of the resistive sections 110, the multiple current shunt device 100 comprises the connecting sections 120, which are typically equal in number to the number of the resistive sections 110. Furthermore, the multiple current shunt device 100 also comprises the common connecting section 130, which, for instance, can be coupled to a common reference potential (e.g. a ground potential (GND)), a current sink or a current source. By using an embodiment, it may be possible not only to reduce the size of the current shunt device itself, but also to reduce the number of leads needed for operation of the device and its required space on a circuit board.

Generally speaking, a multiple current shunt device 100 comprises at least two resistive sections 110 comprising a first resistive section 110-1 and a second resistive section 110-2, as well as at least two connecting sections 120 comprising a first connecting section 120-1 and a second connecting section 120-2 and a common connecting section 130. The first resistive section 110-1 is electrically coupled in between the first connecting section 120-1 and the common connecting section 130. In the embodiment shown in FIG. 1, a direct electrical contact between the first resistive section 110-1 and the first connecting section 120-1 is arranged in one half space 140-1, which is also referred to as the first half space 140-1, on one side of a reference plane 150. The first resistive section 110-1 is, furthermore, directly electrically coupled to the common connecting section 130 by forming a direct electrical contact, which is positioned or arranged in the other half space 140-2 with respect to the reference plan 150 which is also referred to as the second half space 140-2. The electrical contacts of the first resistive section 110-1 with respect to the first connecting section 120-1 and the common connecting section 130 are—in the embodiment shown in FIG. 1—formed by directly bringing the respective sections 110, 120, 130 into contact with one another. The electrical contacts between the respective sections 110, 120, 130 are completely arranged in one of the two half spaces 140-1, 140-2.

In the embodiment shown in FIG. 1, this does not only apply to the electrical contacts between the first resistive section 110-1 and the first connecting section 120-1 and the common connecting section 130, respectively, but also to the electrical contacts formed between the second resistive section 110-2 and the second connecting section 120-2 and the common connecting section 130. In the embodiment shown in FIG. 1 by the solid lines, all of the electrical contacts between the resistive sections 110 and the connecting sections 120 are located in one half space 140-1 (first half space 140-1) with respect to the reference plane 150, while all the electrical contacts between the respective resistive sections 110 and the common connecting section 130 are located in the other half space 140-2 (second half space 140-2).

The reference plane 150 is a virtual reference plane in the mathematical sense, which intersects all of the at least two resistive sections 110. In the embodiment shown in FIG. 1 by the solid lines, the reference plane 150 lies essentially perpendicular to shortest connecting lines connecting the individual connecting sections 120 and the common connecting section 130.

By arranging the electrical contacts between the resistive sections 110 and the connecting sections 120 and the common connecting section 130 in different half spaces 140 with respect to the reference plane 150, it may be possible to determine the geometry of the resistive sections 110 and, hence, the resistances more accurately. Moreover, it may be possible by arranging the electrical contacts between the previously mentioned resistive sections 110 and the connecting sections 120 as well as the common connecting section 130 in the described way to realize a more compact implementation of the multiple current shunt device 100, which may also allow a more compact integration into a circuit.

However, the electrical contacts between the resistive sections 110 and the connecting sections 120 and the common connecting section 130 may also be differently arranged compared to the embodiment shown by the solid lines in FIG. 1. For instance, a multiple current shunt device 100 according to an embodiment is by far not required to be geometrically defined in such a way that a reference plane 150 intersecting all of the at least two resistive sections 110 can be defined. In other words, a multiple current shunt device according to an embodiment may be geometrically designed in such a way that a reference plane 150 intersecting all of the at least two resistive sections 110 does not exist.

This may be, for instance, the case when the common connecting section 130 is geometrically arranged in between at least two of the at least two resistive sections 110. For instance, the common connecting section 130 may form a central section of the multiple current shunt device 100, while the resistive sections 110 extend radially outward from the common connecting section 130 such that the connecting sections 120 electrically coupled to the resistive sections 110 are also radially outwardly arranged. A multiple current shunt device 100 may, for instance, be implemented in a stretched fashion or a wedge-like geometry with an angle of, for instance, more than 90° between neighboring resistive sections 110. In other words, a multiple current shunt device 100 comprising exactly two resistive sections 110 and exactly two connecting sections 110 may, for instance, be I-shaped or V-shaped with an angle of more than 90° in between at least two of the at least two resistive sections 110 with a centrally arranged common connecting section 130.

Two sections, objects or structures are neighboring or adjacent when there is no further object, structure or section of the same type arranged in between the two respective objects. However, neighboring or adjacent also comprises the possibility of the two objects, structures or sections abutting or being directly or immediately in contact with one another, which is also referred to as the respective objects being immediately neighboring.

Electrically coupled components, sections or other structures may be directly or indirectly coupled to one another. For instance, the resistive sections 110 may be directly coupled to the connecting sections 120 by bringing these two sections directly into an electrically conducting contact with one another. However, under some circumstances it may be advisable to introduce an intermediate structure or an intermediate layer in between the respective sections, for instance, to enable a better mechanical coupling between them or to reduce an electrical resistance or to improve an electrical conductivity between them. Depending on the fabrication process, such an intermediate layer may, for instance, form due to migration of a material of the resistive sections 110 into the connecting section 120 or vice versa. In this case, an intermediate layer or barrier may form comprising, for instance, a metal complex, a coordination complex, an alloy or the like. Naturally, the same also applies to the electrical contact between the resistive sections 110 and the common connecting section 130.

Depending on the concrete layout and design of a multiple current shunt device 100 according to an embodiment, the multiple current shunt device 100 may be arranged or designed such that a symmetry plane 160 exists, with respect to which the at least two resistive sections 110 are symmetrically arranged. In the embodiment shown by the solid lines in FIG. 1, the two resistive sections 110-1, 110-2 are parallel arranged with respect to the symmetry plane 160, while the common connecting section 130 extends essentially perpendicular to the symmetry plane 160 intersecting this plane. The connecting sections 120 electrically coupled to the respective resistive sections 110 are—in the embodiment shown by the solid lines in FIG. 1—also symmetrically arranged with respect to the symmetry plane 160 extending also essentially parallel to the symmetry plane 160. This arrangement may make it possible to design and implement the multiple current shunt device 100 in a very compact way. As a consequence, it may also be possible to implement such a multiple current shunt device 100 according to an embodiment more efficiently and more compact, leading to a smaller and eventually more efficient implementation of a circuitry, device or system comprising such a multiple current shunt device 100.

However, in other embodiments, it is by far not necessary to arrange the resistive sections 110 in parallel with respect to the symmetry plane 160. For instance, the resistive sections 110 may be arranged to form an angle between them. For instance, when an angle of 90° or less is chosen, it may be possible to define a reference plane 150 as previously outlined and a symmetry plane 160 with respect to the orientation or arrangement of the resistive sections 110. In the case of a multiple current shunt device 100 comprising exactly two resistive sections 110, apart from the parallel orientation depicted by the solid lines in FIG. 1, a multiple current shunt device 100 may also be implemented with resistive sections 110 in a V-shaped arrangement.

Any multiple current shunt device 100 according to an embodiment comprising exactly two resistive sections 110 and exactly two connecting sections 120 may also be referred to as a double current shunt device.

By implementing a multiple current shunt device 100 in such a way that at least one of the reference plane 150 and the symmetry plane 160 exists, it may be possible to implement the multiple current shunt device 100 more compact. It may also be possible to integrate such a multiple current shunt device 100 according to an embodiment more efficiently and more compact into a circuit.

In the case of a multiple current shunt device 100 according to an embodiment, the at least two resistive sections 110 may comprise or may be formed of a material with a smaller variation of the electrical resistivity with temperature than the material of at least one of the at least two connecting sections 120 and the common connecting section 130. Often, these materials comprise a higher electrical resistance. By using a material with a higher electrical resistivity, which is also referred to as the specific electrical resistance of the material, it may be possible to more accurately define the (electrical) resistance of the respective resistive sections 110 with respect to the connecting sections 120 in view of mounting variations, current distribution variations and other imperfections, which may occur when implementing a circuit comprising a multiple current shunt device 100. Moreover, by using a material with a smaller variation of the electrical resistivity with temperature, it might be possible to more accurately determine a current flowing through the respective resistive section 110 over a wider range of temperatures, currents and other parameters. For instance, due to the current flowing through the current rails 135, a temperature of the corresponding resistive section 110 may rise due to a self-heating. The energy dissipated in the resistive section 110 may leave partially the multiple current shunt device 100 by its thermal coupling to other parts of the circuit. However, it is also likely to increase the temperature of the resistive sections 110. Due to the small variation of the electrical resistivity with temperature, the resistance of the resistive section 110 only slightly changes due to the temperature, which may allow a more accurate determination of the current flowing through the device 100.

To allow an easy connection of the connecting sections 120 and the common connecting section 130 to a printed circuit board (PCB) or another carrier by soldering, the material used for any of these connecting sections 120, 130 may also be a solder configured to provide an electrical and/or mechanical connection to the printed circuit board or the carrier by soldering.

In principle, all materials being sufficiently electrically conductive may be used in the framework of a multiple current shunt device 100 for the resistive sections 110 and the connecting sections 120, 130, respectively. For instance, depending on the currents to be determined by the multiple current shunt device 100 according to an embodiment, using metallic materials such as metals, alloys or other metallic materials may be advisable. For instance, aluminum (Al) and copper (Cu) may be used or comprised in the material used for the connecting sections 120 and the common connecting section 130. For instance, an alloy such as a copper-nickel alloy (Cu/Ni alloy) may be used as a material for the resistive sections 110. Such an alloy may, for instance, offer the opportunity of a smaller variation of the electrical resistivity with temperature compared to a pure metal such as copper (Cu). Moreover, its electrical resistivity is typically higher than that of a purer metal such as the previously mentioned copper (Cu). As a consequence, the electrical resistance of the series connection of the respective connection section 120 (e.g. connecting section 120-1), the respective resistive section 110 (e.g. resistive section 110-1) and the common connecting section 130 may be mostly determined by the electrical resistance of the resistive section 110 due to its geometry and its higher electrical resistivity.

The materials of the at least two resistive sections 110 and of the at least two connecting sections 120 as well as of the common connecting section 130 may comprise the previously defined relationships in terms of their electrical resistivities and of the variations of their respective electrical resistivity with temperature at a specified temperature, for instance at 0° C. (273.15 K), 20° C. (293.15 K) or 25° C. (293.15 K; 77 F). However, in embodiments of a multiple current shunt device 100 these relationships between the electrical resistivities and the variations of the electrical resistivity with temperature may also be present in a specified temperature range comprising a lower boundary temperature and an upper boundary temperature being higher than the lower boundary temperature. The lower boundary temperature may, for instance, be equal to −50° C., −20° C., 0° C. or 5° C. Similarly, the upper boundary temperature may, for instance, be equal to 150° C., 100° C., 75° C., 50° C. or 25° C.

In a multiple current shunt device 100 according to an embodiment, the materials of the at least two resistive sections 110 may be chosen to be essentially identical. This can, for instance, be realized by fabricating the at least two resistive section 110 simultaneously. As a consequence, a variation of the chemical composition of the at least two resistive sections 110 may be reduced or even eliminated. Consequently, a relative variation of the resistances of the resistive sections 110 may be further reduced, leading to a more accurate determination of the currents provided to the multiple current shunt device 100.

The same may also apply in a multiple current shunt device 100 according to an embodiment to the materials of the at least two connecting sections 120 and, optionally, also to the common connecting section 130. Also these sections may be fabricated from essentially identical materials, for instance, by fabricating these sections simultaneously. As a consequence, also the variations of the resistances of the respective sections may be reduced with respect to one another or even completely eliminated. This may lead to a more homogeneous or equal distribution of the current provided to the multiple current shunt device 100 and, therefore, to a more even distribution of the current to the respective resistive sections 110 and to a more accurate determination of the currents.

As outlined before, the connecting sections 120 along with the common connecting section 130 are designed to provide the currents to be determined to the multiple current shunt device 100. By implementing a multiple current shunt device 100 accordingly, the at least two connecting sections 120 and the common connecting section 130 may be configured to be directly mountable onto a printed circuit board (PCB). Naturally, any device configured to be directly mountable onto a PCB may utilize solder, solder paste or any other electrically conductive adhesive to provide both, mechanical stability and electrical conductivity. For instance, the multiple current shunt device 100 can be configured to be directly mountable with all of the at least two connecting sections 120 and the common connecting section 130 onto the same side of the printed circuit board. For instance, the multiple current shunt device 100 can be implemented to be a surface mountable device (SMD) allowing a multiple current shunt device 100 to be directly soldered onto the printed circuit board and, therefore, on the same side of the printed circuit board. Moreover, the device 100 may also comprise pins or other leads to allow the device 100 to be directly mountable, e.g. via a through-hole mounting, onto the PCB.

The multiple current shunt device 100 as shown by the solid lines in FIG. 1 is a multiple current shunt device 100 according to an embodiment comprising exactly two resistive sections 110 and comprising exactly two connecting sections 120. In other words, the multiple current shunt device 100 shown by the solid lines in FIG. 1 is a double current shunt device to which two independent currents can be provided. For instance, one of the currents can be provided to the first connecting section 120-1 being transferred into the first resistive section 110-1 and into the common connecting section 130, from where it can be extracted. The first connecting section 120-1, the first resistive section 110-1 and the common connecting section 130, therefore, form a first current rail. Similarly, the second current of the two currents can be provided to the second connecting section 120-1, passing through the second resistive section 110-2 and the common connecting section 130. The second connecting section 120-2, the second resistive section 110-2 and the common connecting section 130, therefore, form a second current rail. In the sequel we denote the union of first and second (and possibly further) current paths 135 simply as the current path. In other words, the common connecting section 130 serves as a common terminal through which both currents pass when being provided to or extracted from the multiple current shunt device 100 as shown in FIG. 1.

Although the number of connecting sections 120 and the number of resistive sections 110 has always been equal so far, the number of connecting sections 120 and the number of resistive sections 110 may be different. For instance, under some circumstances it might be advisable to electrically couple two or more connecting sections 120 to a single resistive section 110 to allow, for instance, providing different currents to the same resistive section 110. However, it may also be advisable, under some circumstances, to couple two or more resistive sections 110 to a single connecting section 120.

However, in the multiple current shunt device 100 according to an embodiment the first connecting section 120-1 is electrically coupled to the second connecting section 120-2 only via a series connection of the first resistive sections 110-1, the common connecting section 130 and the second resistive section 110-2. In other words, apart from the electrical connection via the common connecting section 130, the first and second resistive sections 110-1, 110-2 and the first and second connecting sections 120-1, 120-2 are electrically insulated from one another, respectively.

The multiple current shunt device 100 as shown by the solid lines in FIG. 1, comprises exactly two resistive sections 110-1, 110-2 and exactly two connecting sections

120-1, 120-2. Due to the previously described symmetry with respect to the symmetry plane 160 and the parallel and symmetrical arrangement with respect to the reference plane 150 of the resistive sections 110-1, 110-2, the multiple current shunt device 100 is essentially U-shaped, with the common connecting section 130 forming the cross-connection of the U and the two resistive sections 110 and the connecting sections 120 forming the two legs of the U-shape.

However, as outlined before, the number of resistive sections 110 and the number of connecting sections 120 may be larger than two. To illustrate this, FIG. 1 further shows a second embodiment of a multiple current shunt device 100 according to an embodiment. It comprises a third resistive section 110-3 also parallel arranged with respect to the other two resistive sections 110-1, 110-2 and a third connecting section 120-3 parallel arranged to the first and second connecting sections 120-1, 120-2 and electrically coupled to the third resistive section 110-3. The common connecting section 130 is also coupled to the third resistive section 110-3 as illustrated by the solid and dashed lines in FIG. 1. Hence, the third resistive section 110-3 is also electrically coupled in between the third connecting section 120-3 and the common connecting section 130.

Due to the parallel arrangement of the third resistive section 110-3 and its associated connecting section 120-3 with respect to the first and second resistive sections 110-1, 110-2 and their associated connecting sections 120-1, 120-2, respectively, the multiple current shunt device 100 according to an embodiment is essentially W-shaped. As a consequence, this multiple current shunt device 100 comprises a symmetry plane 160', which is parallelly displaced with respect to the symmetry plane 160 intersecting the second resistive section 110-2 and its associated connecting section 120-2.

Figure 2:
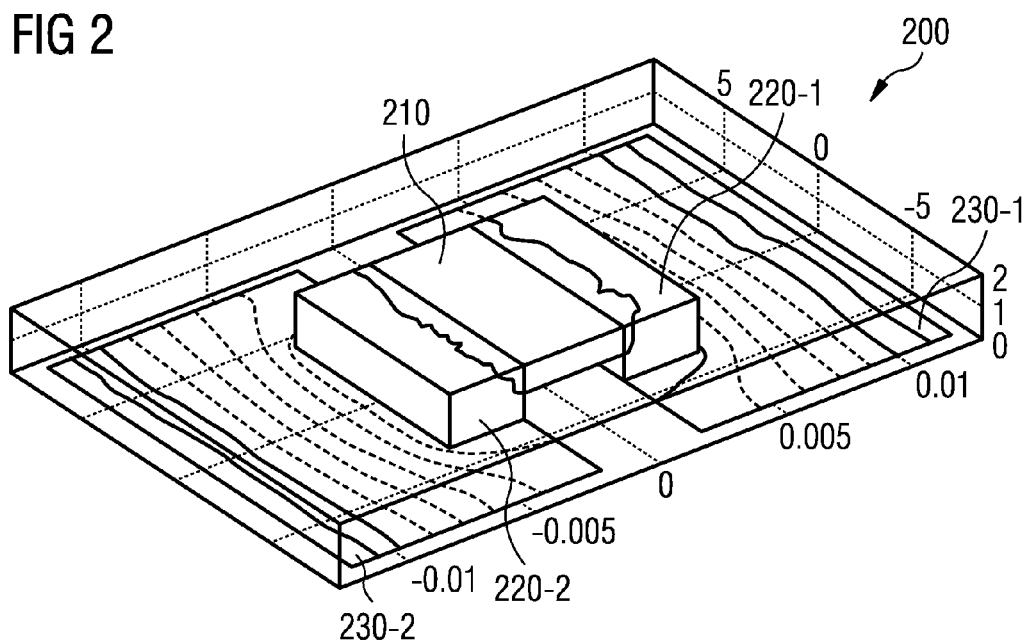
FIG. 2 shows a perspective view of a single current shunt device along with results of a simulation indicating an electric potential distribution, when a current is applied to the single current shunt device.

As outlined before, embodiments relate to current shunts for current measurements. Conventionally, these are composed of a resistive sections and contact sections. To illustrate this, FIG. 2 shows a perspective view of a conventional current shunt 200 along with simulated lines indicating points of equal electric potential measured in volts (V). The current shunt 200 comprises the previously mentioned resistive portion 210 along with two contact portions 220-1, 220-2, in between which the resistive portion is electrically coupled. The contact portions comprise two contact areas, where the current shunt 200 can be soldered to a printed circuit board comprising two electrically insulated leads 230-1, 230-2. Alternatively or additionally, the contact portions 220 may also be bolted or coupled to a busbar.

The contact portions 220 consist of a good electrical and thermal conductor, typically copper (Cu) or aluminum (Al). The resistive portion 210 is usually made of an alloy that has a small or vanishing temperature dependence of resistivity. If a current flows across the current shunt 200, a voltage drop occurs. This voltage is in many applications approximately 10 mV and can be measured by a circuitry not shown in FIG. 2. Based on a measured voltage, the current may be estimated according to Ohm's law $I=V/R$, wherein I is the current, V the measured voltage and R the resistance of the current shunt 200. Inaccuracies are due to placement tolerances of the current shunt 200 versus the PCB-current traces or leads 230, varying trace geometry, different thicknesses of the PCB leads 230 as well as solder joints, process tolerances with respect to the alloy and geometrical tolerances of the current shunt 200. For instance, the length, the width and the thickness of a resistive portion 210 may lead to variations in terms of the resistance R of the current shunt 200. These variations may add up to several percent.

However, there are occasions and applications, where a demand exists to measure more than one current, such as, for instance, a control unit or controller circuit for a brushless DC motor (DC=direct current).

Figure 3:
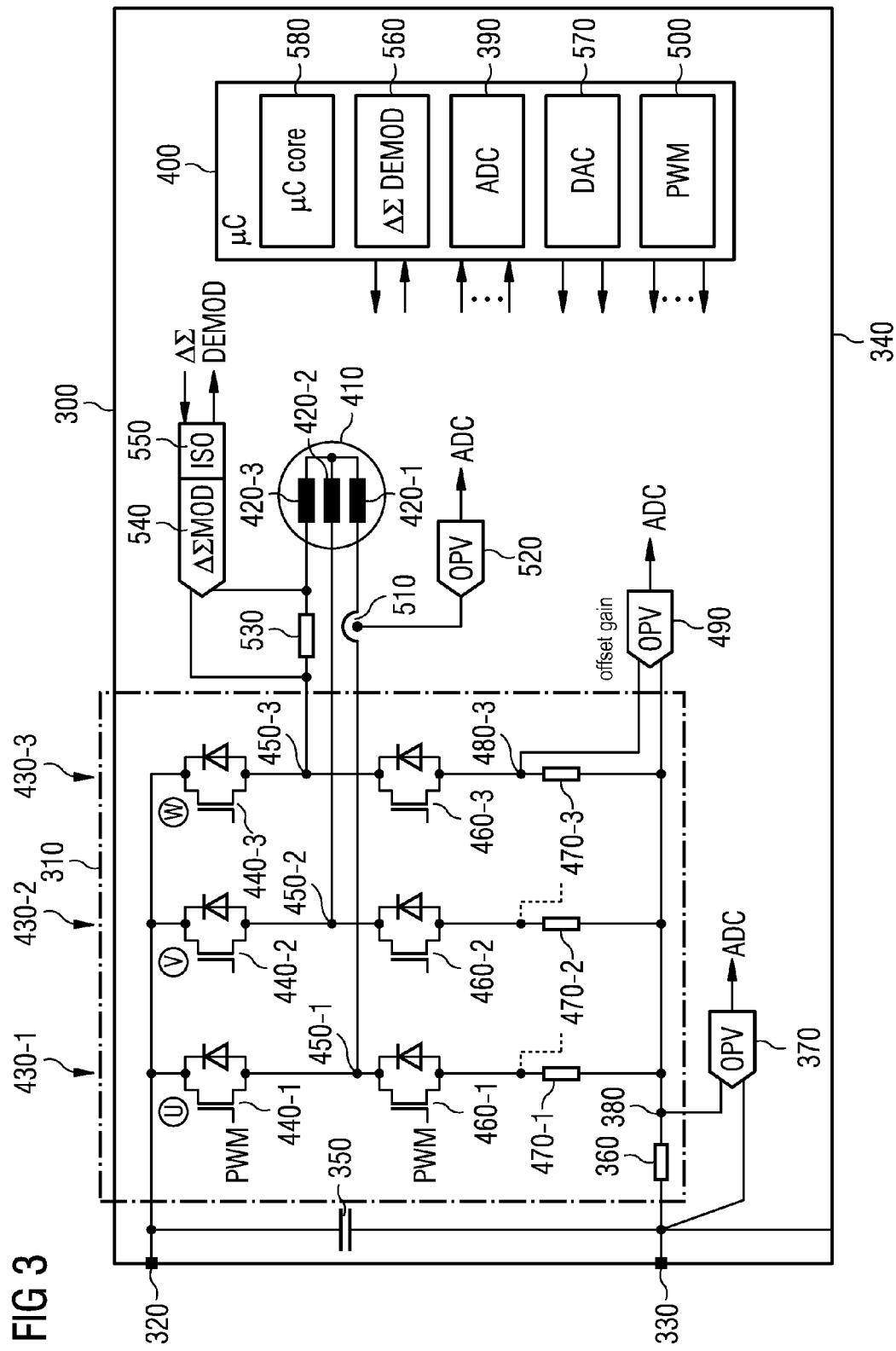
FIG. 3 shows a simplified circuit diagram of a control unit for a brushless DC motor.

FIG. 3 shows a simplified circuit diagram of a control unit 300 for a brushless DC motor. The control unit 300 comprises an inverter 310 coupled to a first terminal 320 and a second terminal 330 of the control unit 300. The first terminal 320 is configured to be supplied with a supply potential, while the second terminal 330 is configured to be supplied with a reference potential, for instance, a ground potential. The second terminal 330 is, accordingly, also coupled to a chassis 340 of the control unit 300.

In between the first and second terminals 320, 330 a capacitor 350 is connected, which is configured to dampen voltage variations occurring at the two terminals 320, 330 with respect to one another. The control unit 300 further comprises a first shunt 360 coupled in between the second terminal 330 and the inverter 310. The control unit 300 further comprises a first operational amplifier 370 ("OPV"), which is coupled input-wise to the second terminal 330 and a first node 380 located between the first shunt 360 and the inverter 310. An output of the first operational amplifier 370 is coupled to an analog/digital converter 390 ("ADC"), which is part of a microcontroller 400 ("µC") also comprised in the control unit 300. The first operational amplifier 370 along with the analog/digital converter 390 is configured to determine a voltage drop across the first shunt 360, when a current flows across the first shunt 360.

The control unit 300 as shown in FIG. 3 is designed for a three-phase brushless DC motor, which is connectable to the control unit 300 by a connector 410. The connector 410 comprises here at least three contacts to which three coils 420-1, 420-2, 420-3 of the motor are connectable. In FIG. 3, the three coils 420-1, 420-2, 420-3 are shown in their connected form to the connector 410 for illustration purposes only. The inverter 310 correspondingly comprises three current paths 430-1 ("U"), 430-2 ("V"), 430-3 ("W"). Each of the three current paths 430 comprises a first switch 440-1, 440-2, 440-3, respectively, which is coupled in between the first terminal 320 and the corresponding node 450-1, 450-2, 450-3, respectively.

Each of the current paths 430 further comprises a second switch 460-1, 460-2, 460-3, which are coupled in between the nodes 450 and second shunts 470-1, 470-2, 470-3, each of which are also coupled to the first node 380 between the inverter 310 and the first shunt 360. Each of the current paths 430 comprises in the circuitry shown in FIG. 3 a further node 480-1, 480-2, 480-3, of which only the further node 480-3 of the third current path 430-3 is labeled with a reference sign. One or more second operational amplifiers 490 ("OPV") is input-wise coupled to the further nodes 480 and the first node 380 and configured to determine a voltage drop across the respective second shunt 470. The second operational amplifier 490 is also coupled to the analog/digital converter 390 ("ADC") of the microcontroller 400.

The first and second switches 440, 460 may be implemented in the form of a great variety of different switching elements comprising, for instance, transistors, or devices based on transistor technology. For instance, the first and second switches 440, 460 may be implemented as field effect transistors, bipolar transistors, insulated gate bipolar transistors (IGBT) to name but a few.

In the circuitry shown in FIG. 3, each of the first and second switches 440, 460 comprises a control terminal, which is coupled to a pulse width modulation circuit 500 (PWM circuit) comprised in the microcontroller 400. By providing the first and second switches 440, 460 with corresponding control signals, the pulse width modulation circuit 500 is capable of controlling the currents flowing through the three respective coils 420-1, 420-2, 420-3.

However, to monitor at least two of the three currents flowing through the coils 420, the control unit 300 further comprises a magnetically operating current sensor 510 coupled in between the node 350-1 and the connection of the connector 410 for the first coil 420-1. The current sensor 510 is coupled to an input of a third operational amplifier 520, an output of which is once again coupled to the analog/digital converter 390 of the microcontroller 400 as illustrated in FIG. 3 by the label "ADC".

The control unit 300 further comprises a third shunt 530 coupled in between a connection of a connector 410 for the third coil 420-3 and the corresponding node 430-3 of the third current path 440-3. A first input of a Δ-Σ-modulator circuit 540 (delta-sigma-modulator; "ΔΣ") is coupled to the third node 350-3, while a second input of the Δ-Σ-modulator 540 is coupled to the connection of the connector 410 of the third coil 420-3. Via an isolation circuit 550 the Δ-Σ-modulator circuit 540 is coupled to a Δ-Σ-demodulator circuit 560 of the microcontroller 400. The isolation circuit 550 may be configured to galvanically isolate an output of the Δ-Σ-modulator 540 from the microcontroller 400 and its Δ-Σ-demodulator circuit 560.

Furthermore, the microcontroller 400 further comprises a digital/analog converter 570 ("DAC") and a microcontroller core or processor core 580, which can, for instance, be implemented based on an ARM-architecture. For instance, the processor core 580 may comprise one or more CORTEX-cores to name just one example.

The control unit 300 may control the coils 420 coupled via the connector 410 by providing the first and second switches 440, 460 with appropriate control signals, which may, for instance, be controlled by a program executed by the processor core 580 of the microcontroller 400. The control signals provided by the pulse width modulation circuit 500 of the microcontroller 400 control the amount of current flowing through the individual coils 420 by controlling the first and second switches 440, 460 of the current paths 440 accordingly.

However, it might be advisable to influence an over-all power provided by the motor, its revolutions per minute and other parameters. Consequently, it may be advisable to measure the so-called phase currents flowing through each of the coils 420. In the circuitry shown in FIG. 3, this can, for instance, be accomplished by the third shunt 530 and the current sensor 510, which offer a galvanic isolation of several kilo volts of the respective current sensors 510, 530, which may, however, eventually cause additional costs. For instance, the current sensor 510 determines the current flowing through the first coil 420-1 by measuring the magnetic field induced by the respective current and offers, therefore, a good galvanic isolation. To improve the isolation with respect to the third shunt 530, the isolation circuit 550 is introduced in between the Δ-Σ-modulator 540.

The first shunt 360 can be used to measure—via the first operational amplifier 370—the current flowing in the ground path towards the second terminal 330. Yet, at this point, the exact distribution of the currents flowing through the coils 420 or, in other words, flowing through the corresponding three half-bridges or current paths 440 of the inverter 310 is unknown.

Therefore, conventional systems utilize the second shunts 470-1, 470-2, 470-3 to measure the currents flowing in each of the current paths 430 or half-bridges. Here, however, one typically needs at least two branches of the corresponding current paths 430 to determine the current distribution flowing through the individual coils 420, since the third current can be calculated. In other words, such an implementation often requires two shunts and two operational amplifiers along with appropriate analog/digital converters in the microcontroller 400, which may be, for instance, implemented as an integrated circuit.

In other words, FIG. 3 shows a circuit diagram of a frequency converter with various facilities for measuring currents using the microcontroller 400. A multiple current shunt device 100 or—in the case of only two currents to be determined or provided to the multiple current shunt device 100—a double shunt solution may also be implemented. The same may also be true for a multiple current sensor device according to an embodiment, which will be described below in more detail.

Figure 4:
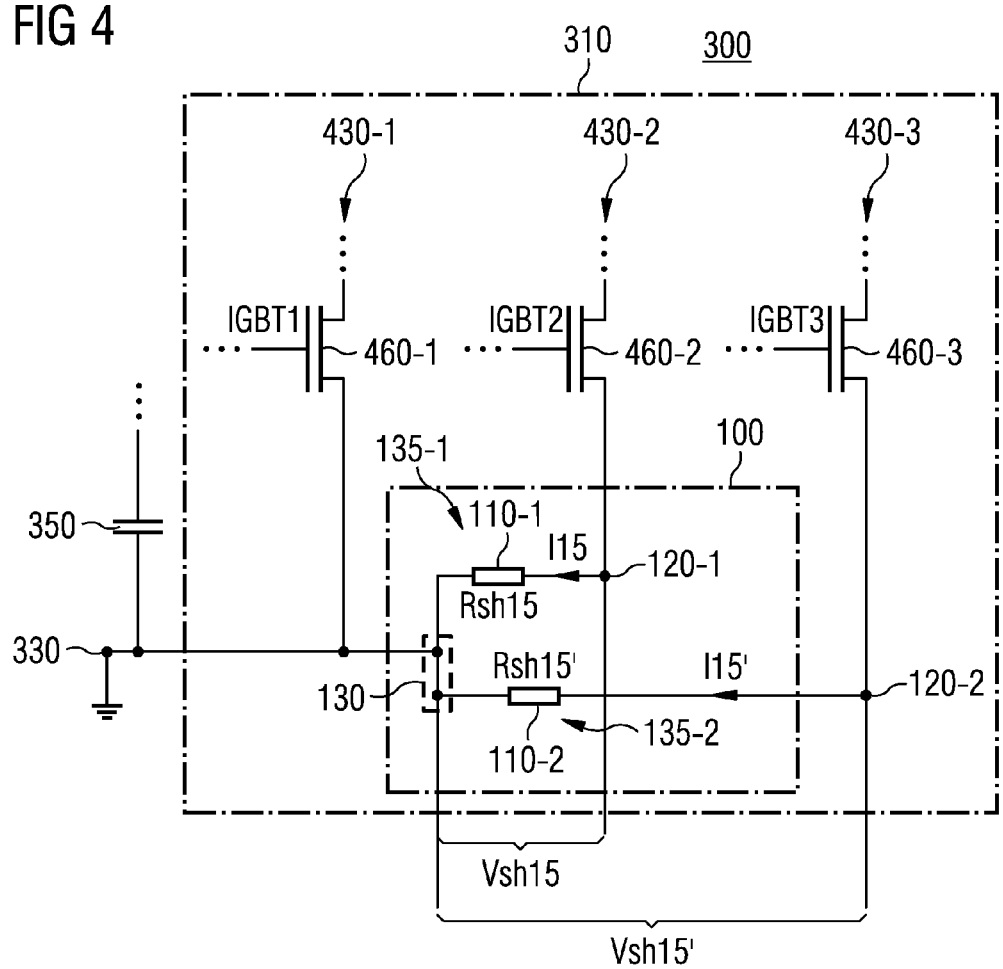
FIG. 4 shows a partial circuit diagram of a motor control unit for a brushless DC motor comprising a multi-current shunt device according to an embodiment or a multiple current sensor device according to an embodiment.

FIG. 4 shows a partial circuit diagram of a control unit 300 employing a multiple shunt device 100 according to an embodiment. To be more precise, FIG. 4 shows only the three low-side second switches 460-1, 460-2, 460-3, which are implemented as insulated gate bipolar transistors also referred to as IGBT 1, IGBT 2 and IGBT 3, respectively. In yet other words, FIG. 4 only shows the low-sides of the half-bridges (current paths 430) of the inverter 310.

However, comparing the circuit diagram as shown in FIG. 4 with a circuit diagram of FIG. 3, the first second shunt 470-1 of the current path 430-1 has been omitted. Furthermore, the second and third second shunts 470-2, 470-3, respectively, have been replaced by a multiple current shunt device 100 comprising exactly two resistive sections 110 shown in FIG. 4 as resistors with the resistance values Rsh15 and Rsh15', respectively. The resistive section 110-1 is coupled to the second switch 460-2 of the second current path 430-2, while the resistive section 110-2 is coupled to the second switch 460-3 of the third current path 430-3. To facilitate this, the connecting sections 120-1, 120-2 of the multiple current shunt device 100 are electrically coupled to the second switches 460-2, 460-3. The common connecting section 130 is electrically coupled to the second terminal 330 to which also the ground potential is coupled. In this circuit, the optional first current shunt 360 is not implemented. By detecting the voltage drops across the two resistive sections 110-1, 110-2, which are also labeled in FIG. 4 as Vsh15 and Vsh15', which are caused by currents I15 and I15', respectively, flowing through the second switches 460-2, 460-3, respectively, the currents I15 and I15' can be determined using Ohm's law.

The multiple current shunt device 100 as shown in FIG. 4 comprises, in other words, exactly two current inputs and one current output in the circuit shown here. It furthermore comprises two voltage outputs Vsh15 and Vsh15', which supply the voltage drops over both resistive sections 110 acting as current shunt resistors Rsh15 and Rsh15' based on Ohm's law according to I15=Vsh15/Rsh15 and I15'=Vsh15'/Rsh15'.

Figure 5:
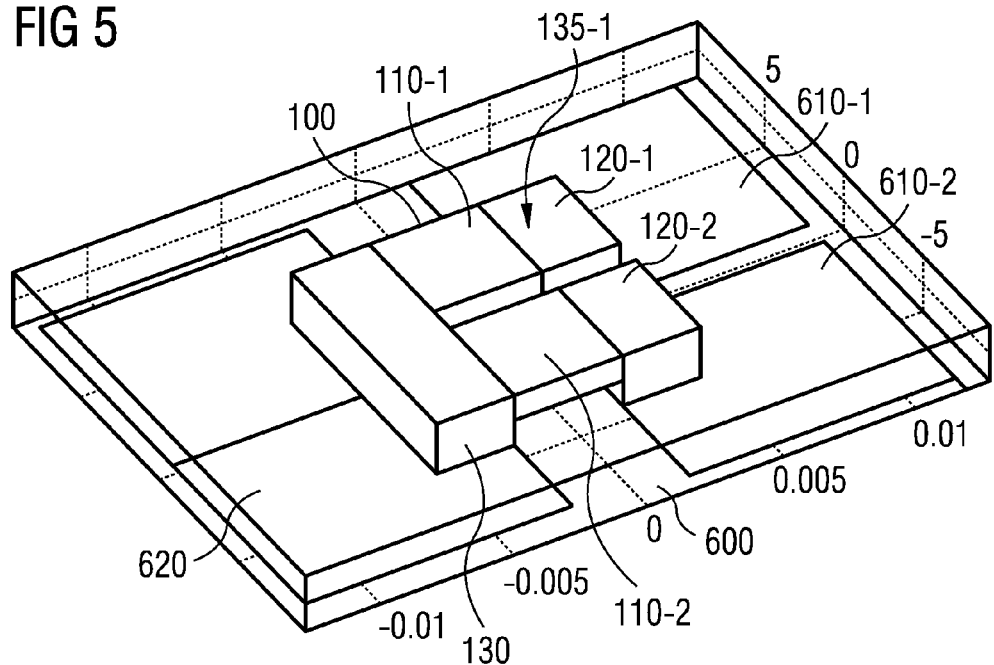
FIG. 5 shows a perspective view of a multiple current shunt device according to an embodiment.

FIG. 5 shows a perspective view of a multiple current shunt device 100, implemented as a double current shunt device with exactly two resistive sections 110-1, 110-2, exactly two connecting sections 120-1, 120-2 and one common connecting section 130. To be more precise, the multiple current shunt device 100 is shown in FIG. 5 is installed and mounted on a printed circuit board 600 (PCB) comprising a first current line 610-1 and a second current line 610-2, which are electrically coupled to the connecting sections 120-1, 120-2, respectively. The two current lines 610 are separated from one another on the printed circuit board 600 to ensure an electrical insulation of the two currents suppliable to the multiple current shunt device 100 via the two current lines 610.

The common connecting section 130 is electrically coupled to a common current line 620, that may be connected to the previously mentioned reference potential, for instance, to a ground potential. Hence, a current supplied via the first current line 610-1 can pass the connecting section 120-1, the resistive section 110-1 and the common connecting section 130 to reach the common current line 620. Accordingly, a current supplied to the current line 610-2 can enter the multiple current shunt device 100 at the connecting section 120-1, pass the resistive section 110-2 and leave the multiple current shunt device 100 via the common connecting section 130, reaching the common current line 620. However, the voltage sense lines have been omitted in FIG. 5 for clarity reasons and are, hence, not visible. The current lines 610, 620 are also referred to as pathways, traces or leads, e.g. as current pathways, current traces or current leads.

Figure 6:
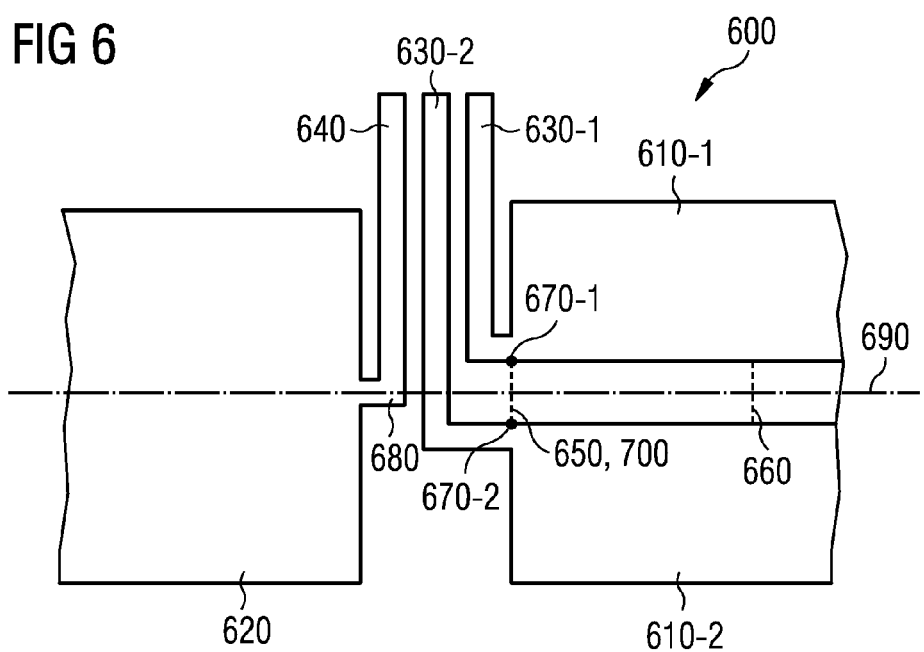
FIG. 6 shows a plan view of signal lines on a printed circuit board (PCB) according to an embodiment.

FIG. 6 shows a plan view of a printed circuit board 600 as shown in FIG. 5. However, for the sake of clarity only, the multiple current shunt device 100 according to an embodiment has been omitted in FIG. 6. Apart from the first and second current lines 610-1, 610-2 and the common current line 620, FIG. 6 also illustrates a first sense line 630-1 ending in the first current line 610-1. The printed circuit board 600 further comprises a second sense line 630-2 ending in the second current line 610-2 and a common sense line 640 ending in the common current line 620. The sense lines 630, 640 are also referred to as pathways, traces or leads, e.g. as sense pathways, sense traces or sense leads.

The current lines 610 and the common current line 620 typically comprise a width larger than that of the sense lines 630 and the common sense line 640. In embodiments of a printed circuit board 600, the widths of the current lines 610 and of the common current line 620 may be wider by a factor of, for instance, at least 2, at least 3, at least 4 or at least 5 compared to the corresponding width of the sense lines 630 and the common sense lines 640, respectively.

As FIG. 6 shows, the PCB-layout with the three voltage sense lines 630-1, 630-2, 640, is designed such that the smallest distance between the first sense line 630-1 and the second sense line 630-2 is essentially equal to a smallest distance 660 between the first current line 610-1 and the second current line 610-2. The distance 650 between the first and second sense lines 630-1, 630-2 is determined at points 670-1, 670-2, where the first sense line 630-1 ends in the first current line 610-1 and the second sense line 630-2 ends in the second current line 610-2.

The common sense line 640 comprises a straight section 680 ending in a common current line 620 and extending along a first straight 690. The first straight 690 may be a symmetry line of the common current line 620 at least in a region close to where the straight section 680 ends in the common current line 620. Assuming a homogeneous distribution of the current inside the common current line 620, this arrangement may help to weight the current contributions flowing in the respective current rails 135 (not shown in FIG. 6). Accordingly, the first and second sense lines 630-1, 630-2 may be positioned at a place, where only a small current flow is expected.

For instance, the first and second sense lines 630-1, 630-2 may be positioned at a place centrally intersecting a second straight 700 connecting the points 670-1, 670-2, where the first sense line 630-1 ends in the first current line 610-1 and the second sense line 630-2 ends in the second current line 610-2, respectively. In other words, the straight section 680 of the common sense line 640 is centrally arranged with respect to corresponding sections of the first and second sense lines 630-1, 630-2 extending along the first straight 690. In yet other words, the straight section 680 is placed along the first straight 690 and in a direction perpendicular to the straight 690 in the middle between the two previously mentioned points, 670-1, 670-2.

In the embodiment shown in FIG. 6, the first straight 690 intersects the second straight 700 perpendicularly. However, in other embodiments an angle between the first and second straights 690, 700 may be different from 90°.

In the printed circuit board 600 as shown in FIG. 6, the current line 610-1, 610-2 and the common current lines 620 are implemented as PCB current traces, where the common current line 620 is part of the ground path and the current lines 610-1, 610-2 may be connected to the second switches of the respective current paths 430 as shown in FIG. 4. The second switches 460 as well as the first switches 440 may, for instance, be implemented as end-channel metal oxide semiconductor field-effect transistors (MOSFETs) integrated in the current paths 430, which are also referred to as half-bridges.

As outlined before in the context of FIG. 5, the multiple current shunt device 100 shown there comprises two resistive paths or resistive sections 110-1, 110-2 and three contact parts, the connecting sections 120-1, 120-2 and the common connecting section 130. Comparing the implementation of FIGS. 5 and 6 to the partial circuit diagram of FIG. 4, the resistive sections 110-1 is essentially equal to the resistor with the resistance Rsh15, over which the current I15 flows from the first current line 610-1 to the common current line 620, as already indicated in FIG. 4. Correspondingly, the resistive section 110-2 is essentially equal to the resistance Rsh15' of the resistor indicated in FIG. 4 as the second resistive section 110-2, over which the current I15' flows from the second current line 610-2 to the common current line 620.

However, the arrangement of the three voltage sense lines, the first and second sense lines 630-1, 630-2 and the common sense lines 640, is carefully chosen in the arrangement shown in FIG. 6. The sense lines 630-1, 630-2, which tap the potentials at the current lines 610-1 and 610-2, respectively, make contact to the inner edges of the respective current lines 610. The inner edges of those may be facing each other and the first straight 690.

By this way, the voltage drop Vsh15, which is essentially equal to a potential difference between the common sense line 640 and the first sense line 630-1, and the voltage drop Vsh15', which is essentially equal to a potential difference between the common sense line 640 and the second sense line 630-2, are least affected by small tolerances of the placement of the traces or current lines 610, 620 or placement tolerances of the multiple current shunt device 100 with respect to the printed circuit board 600, as well as small inaccuracies of the solder junctions between the connecting sections 120, 130 and the current lines 610, 620, respectively.

Compared to a conventional approach using a single current shunt for each of the multiple currents to be detected, only one ground or common sense line 620 is needed when using a multiple current shunt device 100 according to an embodiment. In contrast, in a conventional approach, two separate current shunt resistors would each need one dedicated ground sense line, which makes in total two ground sense lines. In other words, by using a multiple current shunt device 100 according to an embodiment, space may be saved on a printed circuit board 600.

Besides saving space for the current shunts themselves, the accuracy may also be improved. The two resistive sections 110-1, 110-2 may be made in the same production step, as will be outlined below. As a consequence, the resistive section 110 may be implemented so that the material parameters match very well. Moreover, it may be possible to test the respective resistive sections 110 together, which may also improve a good matching of the respective parameters. Furthermore, it may be possible to implement the common connecting section 130 as a comparably large section, allowing a good contact between the resistive sections 110 so that the resistive sections 110 may have nearly the same temperature under operating conditions. As a consequence, matching resistances of the resistive sections 110 may be improved even during operation.

Therefore, a printed circuit board 600 according to an embodiment may comprise a multiple current shunt device 100 comprising at least two resistive sections 110 comprising a first resistive section 110-1 and a second resistive section 110-2, at least two connecting sections 120 comprising a first connecting section 120-1 and a second connecting section 120-2, and a common connecting section 130. The first resistive section 110-1 of the at least two resistive sections 110 is electrically coupled in between the first connecting section 120-1 of the at least two connecting sections 120 and the common connecting section 130. Similarly, the second resistive section 110-2 of the at least two resistive sections 120 is electrically coupled in between the second connecting section 110-2 of the at least two connecting sections 110 and the common connecting section 130. At least one of the at least two resistive sections 110 comprises a material with a smaller variation of the electrical resistivity with temperature than a material of at least one of the at least two connecting sections 120 and the common connecting section 130. The printed circuit board 600 further comprises a first current trace 610-1 electrically coupled to the first connecting section 120-1, a second current trace 610-2 electrically coupled to the second connecting section 120-2, a common current trace 620 electrically coupled to the common connecting section 130, a first sense line 630-1 ending in the first current line 610-1, a second sense line 630-2 ending in the second current line 610-2 and a common sense line 640 ending in the common current line 620. A smallest distance 650 between the first sense line 630-1 and the second sense line 630-2 at the points 670, where the first sense line 630-1 ends in the first current line 610-1 and the second sense line 630-2 ends in the second current line 610-2, is essentially equal to a smallest distance 660 between the first current line 610-1 and second current line 610-2. The common sense line 620 comprises a straight section 680 ending in the common current line 620 and extending along a first straight 690 centrally intersecting a second straight 700 connecting the points 670, where the first sense line 630-1 ends in the first current line 610-1 and the second sense line 630-2 ends in the second current line 610-2.

FIG. 7 shows a flow chart of a method for providing a multiple current shunt device or a multiple current sensor device according to an embodiment. In a first operation, at least two resistive sections 110 comprising the first resistive section 110-1 and the second resistive section 110-2 are provided. In an operation as 110 at least two connecting sections 120 comprising the first connecting section 120-1 and the second connecting section 120-2 are provided. In an operation as 120 the common connecting section 130 is provided. The operations S100, S110 and S120 are executed in such a way that the first resistive section 110-1 is electrically coupled in between the first connecting section as 120-1 and the common connecting section 130. Similarly, the operations S100, S110 and S120 are executed such that the second resistive section 110-2 is electrically coupled in between the second connecting section as 120-2 and the common connecting section 130. At least one of the at least two resistive sections 110 comprises a material with a smaller variation of the electrical resistivity with temperature. Optionally, the material may comprise a higher electrical resistivity than the material of at least one of the at least two connecting sections 120 and the common connecting section 130.

The at least two resistive sections 110 are simultaneously provided, e.g. manufactured. As a consequence, it may be possible to reduce a material parameter spread between the at least two resistive sections 110 as outlined before. This may enhance an accuracy of the currents to be determined. Finally, various kinds of crosstalk (thermal, inductive) may be well defined, because both devices are placed in a fixed position, and this offers the opportunity to take account of these systematic crosstalk effects in post-processing steps thereby improving the accuracy of the current measurements.

Technically, a large variety of different approaches to provide a multiple current shunt device 100 according to an embodiment or a multiple current sensor device, which will be described in more detail below, exists. For instance, depending on the intended field of application, a specified current sustainable, operating temperatures and other device-specific, environmental-specific or operating-specific parameters different techniques may be used. For instance, starting from a suitable line or strain of materials for the resistive sections 110, a common resistive section may be formed by refracting the line or strain of material into suitable pieces. Simultaneously or subsequently, the common resistive section may be separated into the at least two resistive sections 110 comprising the first and second resistive sections 110-1, 110-2. This can, for instance, be implemented by sawing, etching, blanking or a combination thereof. Depending on the concrete implementation and the design of the multiple current shunt device 100 according to an embodiment to be fabricated, it may be advisable, perhaps even necessary, to provide the refracted pieces prior to separating the common resistive section into the individual resistive sections 110 with a carrier of some sort. For instance, depending on the concrete implementation, even the common connecting section 130 may provide a suitable mechanical stability for the further processing of the refracted pieces of material.

Simultaneously, subsequently or prior to any of the previously described operations, the connecting sections 120 may also be provided to the common resistive section or the resistive sections 110. For instance, during separating the common resistive section into the individual resistive sections, a further common connecting section 120 may be simultaneously separated into the individual connecting sections 120 comprising the first and second connecting sections 120-1, 120-2.

The separating of the common resistive section may be performed along the later symmetry plane 160 of the multiple current shunt device 100. During the separating process, a final shape of the multiple current shunt device 100 may, therefore, be at least partially defined.

Any of the connecting sections 120 and the common connecting section 130 may be fabricated by welding, bonding, fusing or attaching the respective material of the connecting sections 120 or the common connecting section 130 to the material of the resistive sections 110. For instance, as a material for any of the connecting sections 120 and the common connecting section 130 a solder layer may be applied to the resistive sections 110 or—at an earlier process stage—to the material of the resistive sections 110. Moreover, it may be possible to provide the previously described structures by galvanically growing the respective sections from the materials onto a carrier. Eventually, it may be useful to provide a conductive seed layer prior to growing the resistive sections, the connecting sections and the common connecting section. Optionally, such a conductive seed layer may or may not be removed. The same also applies to the carrier.

Furthermore, it may be possible to laminate the respective materials and structures onto a carrier or body. Depending on the concrete implementation, it may be possible to simultaneously provide the resistive sections 110 without separating these from the common resistive section, as will be outlined in more detail in the context of FIG. 8. This also applies to the connecting sections 120 and the common connecting section 130 that may also be laminated or—as previously described—galvanically grown. Using these techniques, it may eventually be possible to simultaneously provide the resistive sections 110 and optionally simultaneously the connecting sections 120 and/or the common connecting section 130 along with the connecting sections 120 without separating the respective sections from a common resistive section or a further common connecting section.

As outlined before, the concrete choice of processes to be used during the operations depends on a great variety of parameters, such as application-specific parameters, device-specific parameters, environmental-specific parameters, operational-specific parameters. For instance, galvanically grown sections may be usable for thicknesses from 10 µm to about 200 or 400 µm, while using bulk material such as the previously mentioned line or strain of material, thicknesses and other characteristic dimensions of at least 100 µm may be advisable to implement to provide the necessary mechanical stability during the fabrication process or of the later multiple current shunt device 100. However, additional mechanical support structures may be used to provide additional mechanical stability.

As the previous description of the fabrication process has shown, the operations described above may be executed in the order as outlined in FIG. 7. However, also a different order of the operations or a partly or completely overlapping or concurrent execution of the operations may be performed during an embodiment of a method for providing a multiple current shunt device 100 or a multiple current sensor device, which will be described in more detail below.

In other words, the manufacturing may also be facilitated by starting with a current shunt resistor-like structure as depicted in FIG. 2, originally made of a single structure. In a subsequent production operation or step a slot may be made into the right side of the structure as shown in FIG. 2 in order to split the resistive sections 110-1, 110-2 and the connecting sections 120-1, 120-2 apart to arrive at the structure shown in FIG. 5. It might be advisable to entirely split apart the resistive sections 110-1, 110-2 in order to reduce crosstalk between the two current measurements based on the voltage drops across the respective resistive sections 110. This means that, if the previously mentioned slot or gap between the resistive sections 110-1, 110-2 does not entirely separate the two small portions of the current flowing from, for instance, the first connecting section 120-1 or its associated current lines 610-1 to the common connecting section 130 or its associated common current line 620, an additional voltage may be added to the sense lines 630-2 associated with the resistive section 110-2. Naturally, also the opposite case, when a small part of the current flowing from the second current line 610-2 to the common current lines 620 might add some voltage to the sense line 630-1 associated with the resistive section 110-1. Although this might be acceptable for some systems, it might reduce the accuracy and might therefore be favorable to avoid it in general.

Therefore, an embodiment of a method for providing a multiple current shunt device 100 or a multiple current sensor device 800, as described below, is based on the finding that a trade-off between an efficient integration, a compact integration, a compact implementation and an accurate determination of at least one value indicative of at least one of the multiple currents may be improved by providing the at least two resistive sections 110 simultaneously. By doing so, a probability of variations in terms of material composition of the at least two resistive sections may be reduced, which may lead to an improved accuracy. Moreover, as outlined before, a method according to an embodiment may also improve one or more of the aforementioned aspects of the trade-off.

FIG. 8 shows a perspective view of a further multiple current shunt device 100 according to an embodiment, that comprises a slightly modified construction of the current shunt. FIG. 8 shows the multiple current shunt device 100 from a first perspective, while FIG. 9 shows the same multiple current shunt device 100 from a different second perspective.

The multiple current shunt device 100 of FIGS. 8 and 9 comprises a layered structure of a current shunt resistor, where the best conductive portions forming the common connecting section 130 and the connecting sections 120 form a bottom layer underneath a resistive layer 710 on top. The resistive sections 110-1, 110-2 are formed in the resistive layer 710, which are split from one another by a slot 720, which also effectively splits a major part of the resistive layer 710 into two branches. As described in the context of FIG. 1, the resistive layer comprising the resistive sections 110-1, 110-2 comprises essentially a U-shape in a plan view. Accordingly, also the multi current shunt device 100 as shown in FIGS. 8 and 9 comprises a reference plane 150 and a symmetry plane 160.

However, the difference between the multi-current shunt device 100 as depicted in FIGS. 8 and 9 and the previously described multi-current shunt device 100 according to an embodiment as shown in FIG. 5 is that the resistive layer 710 is not completely split in two parts. The slot 720 does not go entirely through the resistive layer 710. At the left side of the U-shape as shown in FIG. 8, the two branches of the U-shape are held together by a crosslink 730. In order to avoid or at least to reduce crosstalk between the currents provided to the current lines 610-1, 610-2 (currents I15 and I15'), the common connecting section 130 formed from a highly conductive layer may short the left side, in other words the crosslink 730 of the U-shape as shown in FIGS. 8 and 9.

Figure 10A:
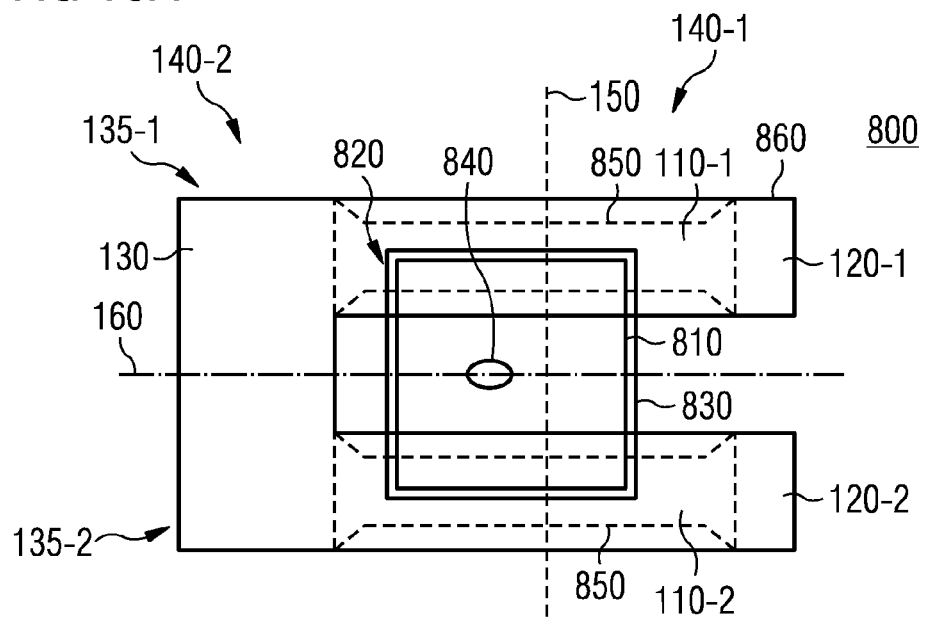
FIG. 10a shows a schematic plan view of a multiple current sensor device according to an embodiment.

FIG. 10*a* shows a multiple current sensor device 800 according to an embodiment. The multiple current sensor device 800 is implemented as a discrete device. The multiple current sensor device 800 comprises a structure similar to that of a multiple current shunt device 100 according to an embodiment. Therefore, many, if not all of the previously described design and implementation opportunities of the multiple current shunt device 100 may also be applied to a multiple current sensor device 800 according to an embodiment.

To be a little more precise, a multiple current sensor device 800 according to an embodiment also comprises at least two resistive sections 110 comprising a first resistive section 110-1 and a second resistive section 110-2. The multiple current sensor device 800 further comprises two connecting sections 120 comprising a first connecting section 110-1 and a second connecting section 120-2 as well as a common connecting section 130. The first resistive section 110-1 is electrically coupled in between the first connecting section 120-1 and the common connecting section 130. Accordingly, the second resistive section 110-2 is electrically coupled in between the second connecting section 120-2 and the common connecting section 130. The connecting sections 120, which are once again configured to allow the resistive sections 110 to be electrically coupled to current traces, signal lines or the like, are resistive sections 110 coupled thereto and the common connecting section 130 form current rails 135.

The multiple current sensor device 800, which is once again implemented as a discrete device, comprises exactly two resistive sections 110-1, 110-2 and, therefore, exactly two current rails 135-1, 135-2. It is U-shaped as outlined before in the context of the corresponding multiple current shunt device 100. This may be an interesting implementation, since it may be possible to implement the device 800 with a very low over-all resistance. For instance, the common connecting section 130 may be implemented very wide. Moreover, manufacturing the device 800 may also be simplified. For instance, it may be possible to connect the different materials or portions of the device to be fabricated provided in a band-like form. For instance portions from which the connecting sections 120, the resistive sections 110 and the common connecting section 130 are fabricated, may be provided in the form of a continuous band. This band can then be sawn along the symmetry line 160 to form the resistive sections 110 and the connecting sections 120. To separate the individual structures comprising the current rails 135 of the device 800 to be formed, the saw may cut further every second structure. Alternatively, the individual structures may be formed by other techniques, such as stamping, to name just one further example.

However, the multiple current sensor device 800 further comprises an evaluation circuit 810 which is configured to determine at least one voltage drop across one of the at least two resistive sections 110 when a current passes through the respective resistive section 110. It is furthermore configured to provide a sensor signal indicative of at least one current value of a current flowing through the respective resistive section based on the at least one determined voltage drop. Naturally, the evaluation circuit 810 may be configured to do this for all of the current rails 135. To achieve this, the evaluation circuit is electrically coupled to the current rails 135 such that it is capable of determining at least one voltage drop across the respective resistive section 110 or the resistive sections 110. Depending on the concrete implementation of the multiple current shunt device 100, the evaluation circuit 810 may be coupled to one or more of the resistive sections 110, to one or more of the connecting sections 120 and the common connecting section 130 or any combination thereof.

The evaluation circuit 810 may, for instance, comprise a processing unit capable of calculating from the at least one determined voltage drop and the resistance value of the respective resistive section 110 the current value of the current flowing through the respective resistive section 110 based on Ohm's law. The sensor signal may be provided to a terminal of the evaluation circuit 810 and—as will be outlined below in more detail—provided to a terminal of a multiple current shunt device 100. The evaluation circuit 810 may be implemented as an integrated circuit.

The multiple current sensor device 800 as shown in FIG. 10 may be designed such that any, a subset of or all of the current rails 135, e.g. the at least two resistive sections 110, at least partially form a plane die attach surface 820, which is also referred to as a plane mounting surface. On the plane die attach surface 820 a die 830 or a substrate comprising the evaluation circuit 810 may be arranged. For instance, the die 830 or substrate may be block-shaped extending along three axis X, Y, Z, two of which (e.g. X and Y) form a base area of the die 830, while the third axis (e.g. Z) extends above the base area. The axis X, Y, Z may, for instance, form a right hand coordinate system. A length or height of the die 830 along the third axis (Z-axis) may be smaller than a length along the other two axes (X-axis and Y-axis). In other words, the die 830 may have the form of a flat cuboid comprising to main surfaces parallel to the base area and/or perpendicular to the third axis. Areas to electrically couple the die 830 to other parts of the device 800 or another part of the circuitry may be arranged on one or both main surfaces of the die 830. The die 830 may be attached to the die attach surface 820, for instance, with a backside by, for instance, gluing or soldering the die 830 to the die attach surface. The backside of the die 830 may be one of the main surfaces of the die 830 not comprising areas to electrically couple the die 830.

In other words, it may be possible to attach the die 830 with at least one of its main surfaces in parallel, such as the die 830 of the evaluation circuit 810 is positioned at least partially above any, a subset of or all of the current rails 135. Although it may be advisable under some circumstances such that the die attach surface 820, on which the die 830 rests, is flat in order to make best use of the limited contact area, this surface may also be profiled along the third axis (Z-axis or Z-direction) so that the die rests only on small protrusions from the current rail 135. By arranging the die 830 of the evaluation circuit 810 in this way, it may be possible to implement a multiple current sensor device 800 in a very compact form, since the multiple current sensor device 800 may take less space on a printed circuit board or another circuitry compared to an implementation in which the evaluation circuit 810 and its die 830 is positioned laterally displaced with respect to the resistive section 110, the connecting sections 120 and the common connecting section 130. In other words, by stacking the die 830 of the evaluation circuit 810 on top of at least one of the resistive sections or—to be more precise—onto the die attach surface 820, the overall lateral space required for implementing the multiple current sensor device 800 according to an embodiment may be reduced compared to a solution with a laterally displaced die 830 in a separate plastic encapsulation.

Positioning the die 830 above at least one of the two resistive sections 110 means in this context that the die 830 is positioned along a projection line perpendicular to the die attach surface 820 at least partially above the respective resistive sections 110. As a consequence, the die 830 may be positioned partially above or below one or more of the current rails 135. Naturally, the die attach surface 820 may comprise further areas, for instance, above the connecting sections 120 or the common connecting section 130. In yet other words, the die 830 and the evaluation circuit 810 may be arranged at least partially opposite to or above one, some or all of the at least two resistive sections 110. This may be implemented, for instance, by arranging the at least two resistive sections 110 in a first layer. The die may then be arranged in a second layer oriented parallel to the first layer. Moreover, an orthogonal line, the projection line as previously defined, to the first and second layer exists, intersecting both layers. The orthogonal line may also intersect at least one of the two resistive sections 110 and other structures. This may, for instance, also apply to structures, circuit elements and the like implemented in the evaluation circuit 810 or comprised on the die 830. This might also assist in more compact and more efficiently integrating the multiple current sensor device 800 according to an embodiment into a circuitry or onto a printed circuit board 600.

In the case of a multiple current sensor device 800 based on such a layered structure, such as the multiple current shunt device 100 according to an embodiment as shown in FIGS. 8 and 9, the die attach surface 820 may be parallel arranged with respect to the layers of the respective structure.

Arranging the die 830 of the evaluation circuit 810 above at least one of the at least two resistive sections 110 on the plane die attach surface 820 may also enhance a thermal coupling of the evaluation circuit 810, the die 830 and the respective resistive section or resistive sections 110. As a consequence, a temperature difference between the resistive sections 110 and the evaluation circuit 810 or the die 830 may be reduced, which may improve an accuracy of the determination of the at least one voltage drop or the current value indicative of the current flowing through the respective resistive section 110 as will be outlined below in more detail. A particular merit of this embodiment may be that the resistive section 110 may be manufactured from materials with arbitrary, but well-defined, temperature dependence of electrical resistivity, because this systematic effect may be taken into account by the current sensor if the temperature of the resistive sections is measured by the temperature sensors.

For instance, the multiple current sensor device 800 may further comprise at least one temperature sensor 840, which may be arranged on the die 830, for instance, as a part of the evaluation circuit 810. By implementing at least one temperature sensor 840, it may become possible to determine or at least to estimate the temperatures of the resistive sections 110 based on the temperature characteristics of the device 800. The temperature characteristics for such a device 800 may be based on numerical simulations, calculations, measurements or a combination of any of these techniques. Based on the determined temperature of the resistive sections 110, the resistance of the resistive sections 110 and—by taking the at least one determined voltage drop into account—the current flowing through the respective current rail 135 can be determined. Therefore, by improving the thermal coupling between the resistive sections 110 and the temperature sensor 840, for instance, by improving the thermal coupling between the die 840.

In other words, the evaluation circuit 810 may be alternatively or additionally configured to provide a sensor signal indicative of the temperature of one or more of the resistive sections 110. For instance, it may comprise one or more temperature sensors 840. By determining at least one temperature, it might be possible to improve an accuracy of the determined current value by taking the temperature into account when determining at least one current value. This may be done, for instance, by considering the at least one determined temperature value by determining the resistance of the respective resistive section 110 for which the current value is to be determined.

In yet other words, multiple current sensor device 800 may comprise at least one temperature sensor 840, which is configured to provide at least one signal indicative of at least one temperature value, and wherein the evaluation circuit 810 may be further configured to provide the sensor signal indicative of the at least one current value based also on the at least one signal indicative of the at least one temperature value. The evaluation circuit 810 may, for instance, be configured to take the material dependencies in terms of variations of the resistance of the resistive sections 110 into account. Furthermore, for instance, when only one temperature sensor 840 is implemented as shown in FIG. 10a, a location of a temperature sensor 840 with respect to the positions of the resistive sections 110 and a further connectivity of the die may also be taken into account.

However, in other embodiments of multiple current sensor devices 800 according to embodiments, the number of temperature sensors 840 may be chosen higher. For instance, the evaluation circuit 810 may comprise for each of the at least two resistive sections 110 at least one temperature sensor 840 associated to one of the at least two resistive sections 110. For instance, the evaluation circuit 810 may comprise for all of the resistive sections 110 at least one temperature sensor, which is associated solely to one of the respective resistive sections 110. Naturally, in a multiple current sensor device 800 a temperature sensor 840 may also be associated to more than one of the resistive sections 110.

The temperature sensors may, for instance, be based on a p-n-junction. In other words, a temperature sensor 840 may, for instance, be implemented based on a junction between a p-type and a n-type semiconductor region, which may be created by doping. For instance, the p-type and the n-type semiconductor regions may be created by ion implantation, diffusion of dopants or by growing the respective region epitaxially using a doped material. Naturally, also other temperature sensors may be implemented, for instance, based on thermal contact voltages between a metal (e.g. aluminum (Al)) and a doped semiconductor region, for instance, an n-doped semiconductor region according to the Seebeck effect. A temperature sensor 840 may also be implemented based on a bandgap circuit.

In a multiple current sensor device 800 according to an embodiment comprising more than one temperature sensor 840, the temperature sensors 840 associated with the respective resistive section 110 may be arranged such that an intimate thermal coupling between the temperature sensor 840-1 and its associated resistive section 110-1 exists. The same may also apply to the temperature sensor 840-2 and its associated resistive section 110-2 and, optionally, further temperature sensors 840 and resistive sections 110, if implemented.

For instance, this may be implemented by implementing the contact area between the die 830 of the evaluation circuit as large as possible. Additionally or alternatively, it may be advisable to implement the contact area as plane as possible by, for instance, fabricating the adhesive joints as thin as possible. Moreover, it may be advisable to use an adhesive with a high thermal conductivity. Independent of these details, it may be advisable to use a thin die 830 along the third axis (Z-axis), e.g. thinner than 200 µm, with a thermal capacity as low as possible.

To facilitate a more accurate determination of the temperature of the resistive sections 110, it may be advisable to increase the thermal coupling between the resistive sections 110 and the at least one temperature sensor 840 and to reduce the thermal coupling between all other parts of the system and the at least one temperature sensor 840. For instance, a thermal resistance between the temperature sensor 840 and the corresponding resistive sections 110 may be smaller than 40° C./W or even smaller than 1° C./W. By placing the at least one temperature sensor 840 accord to these rules, it may be possible to more accurately determine the temperature of the respective resistive section 110, which can then, for instance, be used to more accurately determine the resistance of the respective resistive section 110 leading to a more accurate determination of the current value of the current flowing through this resistive section 110. Naturally, in other embodiments of a multiple current sensor device 800, one, some or all of the temperature sensors 840 may be arranged such that they are above an area, in which a current flowing through the respective resistive section 110 causes a temperature rise of at least 70%, of at least 75%, of at least 80%, of at least 85% or of at least 90% of a maximum temperature rise caused in the respective resistive section 110 by the current flowing through it. The closer the temperature sensor 840 is located to the spot in the resistive section 110, where the highest temperature occurs, the more accurate the determination of the resistance value of the resistive section 110 may be. Besides the temperature sensors 840 should be sufficiently distant to on-chip heat sources, which would cause errors in the measurement of the temperature of the resistive sections 110. If not avoidable the multiple temperature sensors associated to different resistive sections, e.g. temperature sensors 840-1 and 840-2 associated with 110-1 and 110-2, respectively, should experience the same temperature error caused by on-chip heat sources, so that at least the errors between the currents through the temperature sensors 840-1 and 840-2 are identical. Thus, ideally the multiple temperature sensors 840 should be located on isothermal lines on the die.

However, in the embodiment shown in FIG. 10a, the evaluation circuit 810 only comprises a single temperature sensor 840, which is located along a symmetry plane 160. In the case of a multiple current sensor device 800 according to an embodiment as shown in FIG. 10a, the symmetry plane 160 exists with respect to which the at least two resistive sections 110-1, 110-2 are symmetrically arranged. These symmetric locations may enable the temperature errors between the temperature sensor 840-1 and the resistive section 110-1 to be essentially identical to the temperature error between the temperature sensor 840-2 and the resistive section 110-2 and, thus, both currents through 110-1 and 110-2 are measured with the same temperature error.

In practice, the position of the die 830 with respect to the resistive sections 110 is prone to placement tolerances. Therefore, it may be difficult to place temperature sensors 840 to exactly in the symmetry plane. Conversely, small placement tolerance of the temperature sensor 840-1 with respect to the resistive section 110-1 and of the temperature sensor 840-2 in view of the resistive section 110-2 may lead to smaller errors in the measurement of the temperatures of the resistive sections 110.

By employing one or more temperature sensors 840, it may be possible to use a material with a larger variation of the resistivity over temperature than in a multiple current shunt device 100 or a multiple current sensor device 800 according to an embodiment without any temperature sensors 840. By taking the temperature of the resistive sections 110 into account, the constraints in terms of the material used for the resistive sections 110 may be eased, allowing, for instance, using cheaper materials or materials with more suitable resistivity.

Moreover, the multiple current sensor device 800 as shown in FIG. 10a is also designed such that—as shown in the context of a multiple current shunt device 100 according to an embodiment in FIG. 1—a reference plane 150 exists, which intersects all of the at least two resistive sections 110 and wherein the electrical contacts between all of the at least two connecting sections 120 and the respective resistive sections 110 are completely arranged in one half space 140-1, while the electrical contact between the common connecting section 130 and all of the at least two resistive sections 110 are completely arranged in another half space 140-2 on the other side of the reference plane 150. As outlined before, the reference plane 150 may, for instance, lie essentially perpendicular to a shortest connecting line between one of the at least two connecting sections 120 and the common connecting section 130.

The structural and functional similarities between a multiple current shunt device 100 according to an embodiment and a multiple current sensor device 800 may be large. For instance, just as described in the context of FIG. 1, also the multiple current sensor device 800 according to an embodiment as shown in FIG. 10a may comprise exactly two resistive sections 110-1, 110-2 and exactly two connecting sections 120-1, 120-2. Since the resistive sections 110-1, 110-2 and the connecting sections 120-1, 120-2 are arranged side by side and, interconnected by the common connecting section 130 like a crossbar, the plan view of the multiple current sensor device 800 is essentially U-shaped.

Moreover, a multiple current sensor device 800 may be designed and configured such that the common connecting section 130 and the at least two connecting sections 120 are configured to be directly mountable onto a printed circuit board 600 (not shown in FIG. 10a).

A multiple current shunt device 100 according to an embodiment as shown, for instance, in FIGS. 1, 5, 8 and 9, may be used as a basis for a multiple current sensor device 800 according to an embodiment. In other words, a multiple current sensor device 800 may be designed and configured such that at least one of the at least two resistive sections 110 comprises a material with a smaller variation of the electrical resistivity with temperature than a material of at least one of the at least two connecting sections 120 and the common connecting sections 130. Naturally, this may also be true not just for one, but for some or all of the resistive sections 110 and, independently, for one, some or all of the connecting sections 120 alone or together with a common connecting section 130. Naturally, the materials of at least two resistive sections 110 may also be chosen to be essentially identical, as well as the materials of the at least two connecting sections 120 may be chosen to be essentially identical, as outlined in the context of the multiple current shunt device 100.

However, in a multiple current sensor device 800 according to an embodiment, at least one of the at least two resistive sections 110 and at least one of the common connecting section 130 and at least one of the at least two connecting sections 120 are fabricated from an essentially identical material. In this case, it may be advisable to implement at least one of the at least two connecting sections 120 comprising at least one of a smaller thickness perpendicular to the die attach surface 820 and a smaller width in a plane parallel to the die attach surface than the connecting section 120 electrically coupled to the respective resistive section 110. In other words, at least one of the resistive sections 110, for instance a resistive section 110-1, may comprise a smaller thickness perpendicular to the die attach surface 820 and/or a smaller width parallel to the die attach surface 820 than the corresponding connecting section 120 being electrically coupled to the respective resistive section. In other words, in the example given, the connecting section 120-1 may be wider and/or thicker than the electrically coupled resistive section 110-1. A possible implementation is shown in FIG. 10a by a dotted line indicating a possible outer shape 850 of the resistive section 110. The goal behind this rule is that the power dissipated in the resistive section 110-1 should be larger than the power dissipated in the associated connecting sections 120-1 and 130. In this case the hot spot may be measured by a temperature sensor 840 on the die 830 more accurately and the voltage drop across the device may be more well-defined and independent of the geometry of the current lines and wires connected to the multiple current sensor device 800. It may be vital to decouple the poorly defined off-chip current geometry (i.e. solder junction and traces on the circuit board) from the resistive sections across which the well-defined voltage drops are measured; this is achieved by connecting sections 120-1, 120-2, 130 if they have potential variations than the resistive section.

FIG. 10a shows a similar outer shape 850 also for the second resistive section 110-2. In other words, the previously described implementation of essentially identical materials of the resistive sections 110, the common connecting section 130 and the connecting sections 120 may apply to some or all of the previously mentioned sections. Moreover, in embodiments of a multiple current sensor device 800 it might be interesting to implement the resistive sections 110 essentially identical, for instance, symmetrically, with respect to the symmetry plane 160, when such a symmetry plane 160 exists.

The material may, for instance, comprise at least one of copper (Cu), aluminum (Al) or any other good conducting material. Naturally, the material may be essentially pure metal, such as the previously mentioned metals, copper and aluminum, but may also be implemented in the form of alloys or other conducting materials comprising further compounds (e.g. solder). As indicated before, by using one or more temperature sensors 840, a stability of the resistivity over temperature of the material of the resistive sections 110 becomes a lower priority. It may, therefore, be possible to save costs by, for instance, fabricating all current carrying parts of the multiple current sensor device 800, e.g. the current rails 135, from the same material, such as a metal sheet. The metal sheet can then be laterally and/or vertically structured, for instance, by at least one of etching, embossing, stamping and drilling at moderate costs.

Figure 11:
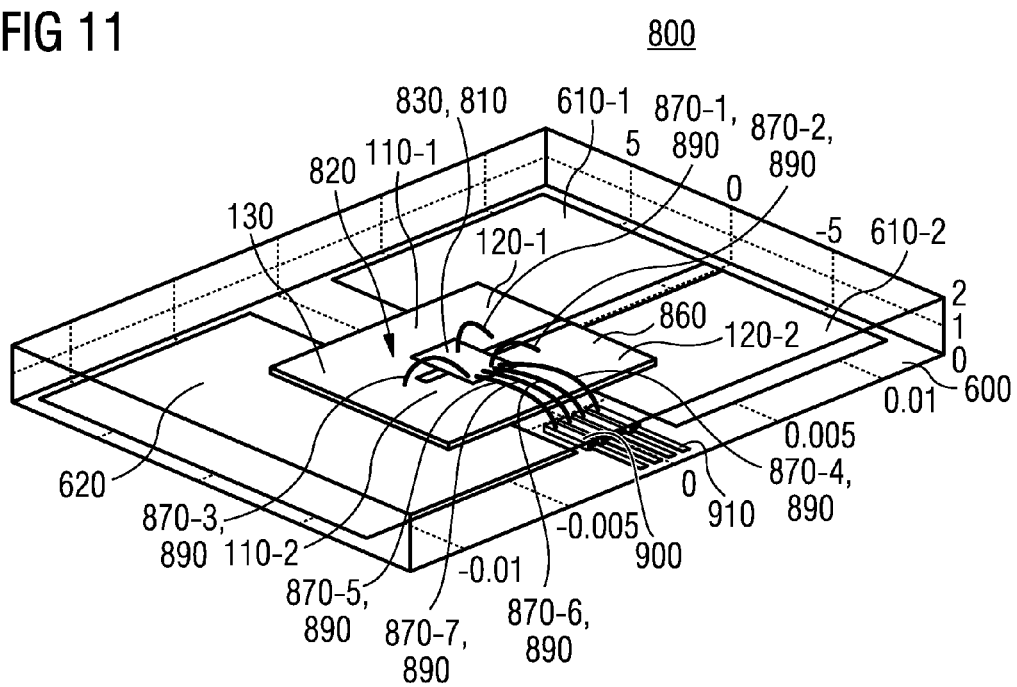
FIG. 11 shows a perspective view of a multiple current sensor device according to an embodiment on a printed circuit board.
Figure 12:
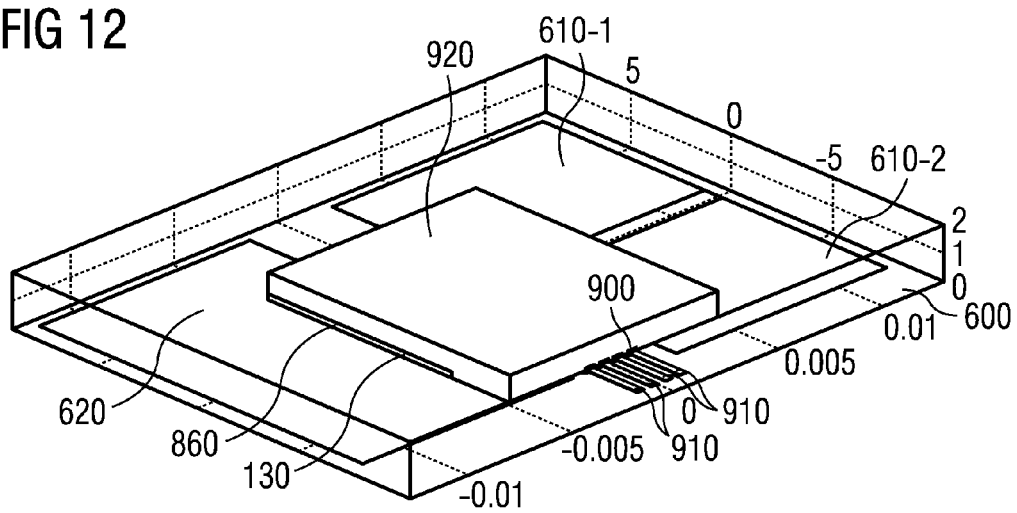
FIG. 12 shows a perspective view of a packaged multiple current sensor device according to an embodiment comprising a mold compound.
Figure 13:
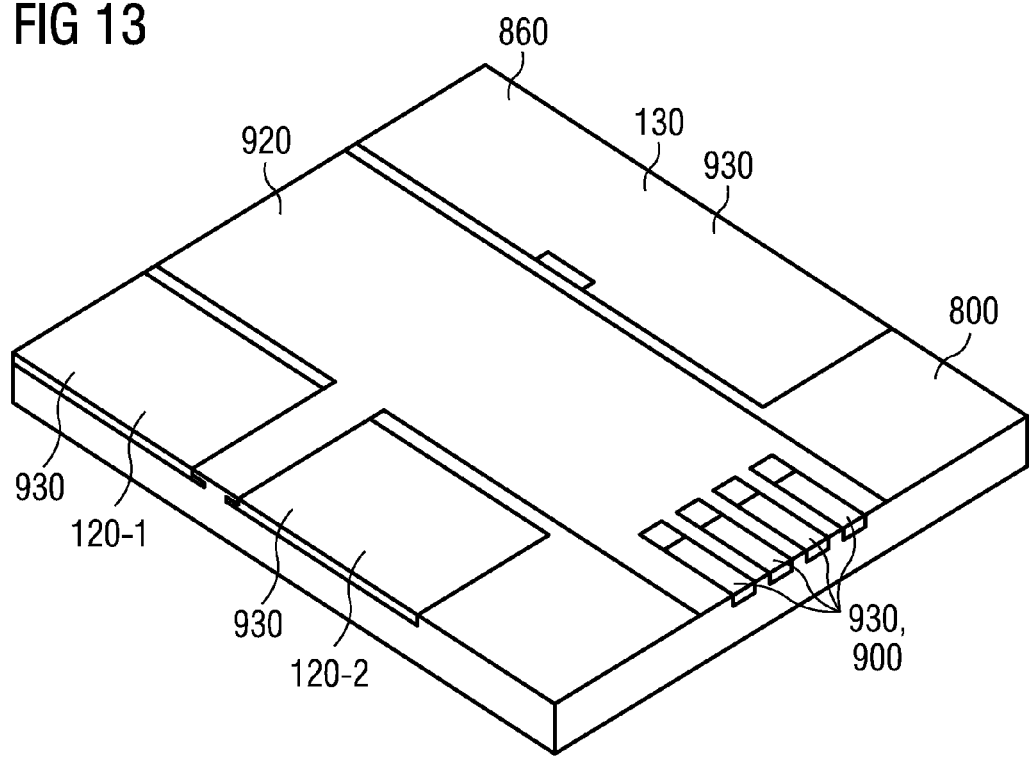
FIG. 13 shows a perspective bottom view of the packaged multiple current sensor device according to an embodiment of FIG. 12.

As will be laid out in more detail in the context of FIG. 11-13, the multiple current sensor device 800 may comprise a leadframe 860, wherein the at least two resistive sections 110 and the at least two connecting sections 120 as well the common connecting section 130 are part of the leadframe. A leadframe 800 is often a metallic structure, for instance a sheet metal, fabricated from a material, an alloy or the like used to electrically connect at least one die comprising at least one electrical or electronic circuit element, an evaluation circuit or the like to a printed circuit board or another larger electric circuitry. The leadframe may be made from a single sheet of material, but may also be made from different parts, for instance, from a thick and a thinner sheet of material. Therefore, all parts of the current rail may be made from a single sheet metal to name just one option. The leadframe, along with the at least one die 830 may be encapsulated in a mold compound, a plastic material or another suitable package material to form a plastic encapsulated chip. In other words, a chip may comprise at least one partially or fully encapsulated die 830 along with the leadframe 810. The at least one die 830 and parts of the leadframe 830 may be completely covered by the material used to encapsulate the die. However, to allow an electrical coupling of the chip, parts of the leadframe, typically, may be left blank. Naturally, there may be applications in which a deviation from the previously described definition may be advisable. For instance, it may be interesting to limit the amount of mold compound, plastic material or other suitable package material in order to leave parts of the die accessible, or to reduce a package size.

However, depending on the concrete implementation, it may also be possible to implement a multiple current sensor device 800 according to an embodiment based on a laminate or an embedded laminate. It may also be possible to galvanically grow the respective structures based on a seed layer or to use printed and optionally centered metallic structures.

Figure 10B:
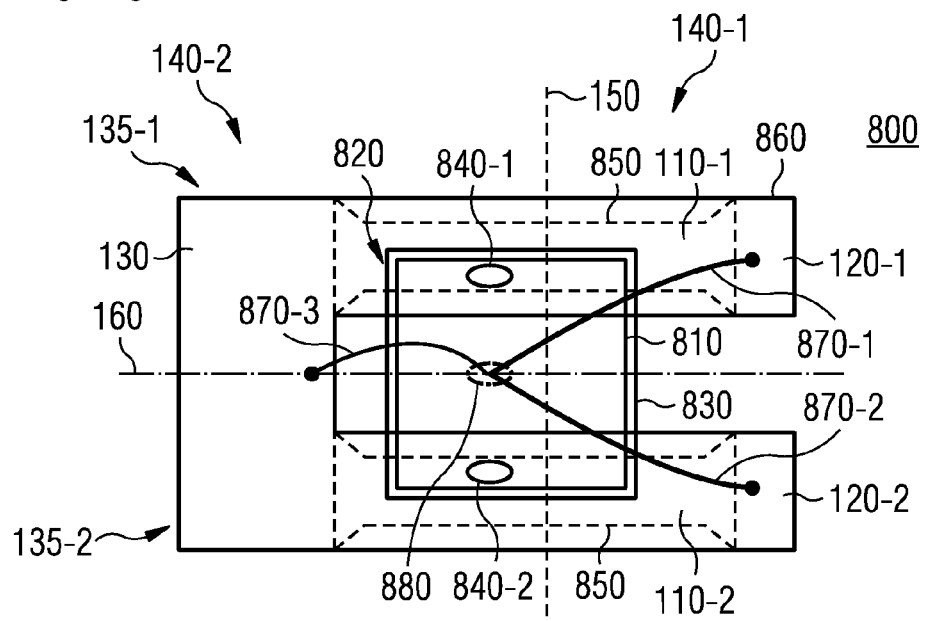
FIG. 10b shows a schematic plan view of a multiple current sensor device according to an embodiment.

FIG. 10b shows a plan view of a further multiple current sensor device 800 according to an embodiment, which is in terms of its structure similar to that shown in FIG. 10a. However, as indicated earlier, a multiple current sensor device 800 may comprise more than one temperature sensor 840. The embodiment shown in FIG. 10b comprises a first temperature sensor 840-1 and a second temperature sensor 840-2, which are associated to the first resistive section 110-1 and the second resistive section 110-2, respectively. Hence, a multiple current sensor device 800 as shown in FIG. 10b comprises for each of the at least two resistive sections 110 at least one temperature sensor 840 associated to one of the at least two resistive sections 110. Moreover, the temperature sensors 840 are arranged above an area of the respective resistive section 110, where a current flowing through the respective resistive section 110 causes a temperature rise of at least 60% of the maximum temperature rise caused in the respective resistive section by a current flowing through it. Naturally, as outlined before, in other embodiments the temperature sensors 840 may be positioned differently, for instance such that they are located above an area where at least 70%, at least 75%, at least 80%, at least 85% or at least 90% of a maximum temperature rise are caused.

The multiple current sensor device 800 as shown in FIG. 10b may be designed such that the symmetry plane 160 exists, with respect to which the at least two resistive sections 110 are symmetrically arranged. The evaluation circuit 810 may be electrically connected via at least one electrical connection 870 leaving the die 830 of the evaluation circuit 810 by, for instance, two different classes of electrical contacts. One of these two classes of electrical contacts comprises contacts to sense the voltage drop across the resistive sections 110, while the electrical contacts of the second class comprises contacts to provide the evaluation circuit 810 with power and to enable a signal exchange with other parts of the system comprising the multiple current sensor device 800. The electrical contacts electrically coupling the evaluation circuit 810 to the resistive sections 110 are not required to be electrically coupled to the resistive sections 110, since an electrical potential in the resistive sections 110 may vary spatially. It may, therefore, be advisable to couple the evaluation circuit 810 to the resistive sections 110 by placing the corresponding contacts to the common connecting section 130 and the connecting sections 120.

For instance, all of the at least one electrical connections 870 may be, with respect to the symmetry plane 160, essentially symmetrically arranged. To be more precise, in the embodiment shown in FIG. 10b, the evaluation circuit 810 may be coupled to the first connecting section 120-1 via a first electrical contact 870-1, which may, for instance, be implemented as a bond wire. The evaluation circuit 810 is further electrically coupled to the second connecting section 120-2 and via a third electrical connection 870-3 to the common connecting section 130. Placing the third electrical connection 870-3 symmetrically in the symmetries plane 160 to the common connecting section 130 may eventually be more advisable than placing electrical connections 870-1, 870-2 symmetrically in other embodiments. The electrical connections 870 are coupled to the evaluation circuit 810 in an area 880, which is symmetrically arranged with respect to the symmetry plane 160. To be more precise, the area 880 is located on the symmetry plane 160 such that the symmetry plane 160 intersects the area 880. Hereby the goal is that any temperature error introduced by the connections 870 should be identical for all temperature sensors 840. As temperature error we mean a difference in temperature between the resistive sections and the temperature detected by the associated temperature sensors.

Although in the embodiment shown in FIG. 10b the evaluation circuit 810 is coupled to the connecting sections 120 and the common connecting section 130 using bond wires as electrical connections 870, in other embodiments different electrical contacts, such as solder dots, electrically conductive bolts or the like may be used. Moreover, a multiple current sensor device 800 according to an embodiment may comprise more than one area 880, in which the electrical connections 870 are coupled to the evaluation circuit 810. For instance, in some embodiments each area 880 may comprise exactly one electrical connection 870. However, even in such a case it might be possible that the multiple current sensor device 800 is designed such that with respect to the symmetry plane 160 all of the electrical connections 870 are symmetrically arranged on the die 830 or the evaluation circuit 810. With this method it is possible to place the bond areas 880 over parts of the die 830, which are supported by underlying resistive sections 110. This may be important when the die 830 is very thin (e.g. thinner than 100 μm), because the die 830 may break if forces too high are exerted onto it during wire bonding procedure or other fabrication operations, if it is unsupported like in FIG. 10b.

FIG. 11 shows a perspective view of a multiple current sensor device 800 according to an embodiment, the resistive sections 110 of which may be formed or even consist of the same material used for the contact portions or connecting sections 120 and the common connecting section 130. However, in order to increase the resistance of the resistive sections 110 over the resistance of the connecting sections 120 and the common connecting section 130, a thickness of the resistive section of the material may be reduced.

The multiple current sensor device 800 as shown in FIG. 11 is an integrated double current shunt current sensor without a mold compound shown. It is soldered to a printed circuit board 600 (PCB) comprising, as already shown in FIGS. 5 and 6, for instance, a first current line 610-1 and a second current line 610-2, which are electrically coupled by soldering these traces to the first and second connecting sections 120-1, 120-2, respectively. The printed circuit board 600 further comprises a common current line 620, which is electrically coupled by soldering to the common connecting section 130.

The resistive sections 110, the connecting sections 120 and the common connecting section 130 are, as outlined before, fabricated from a common leadframe 860. In the resistive sections 110 the thickness of the leadframe 860 is reduced at a side facing the printed circuit board 600. The side facing away from the printed circuit board 600 is, however, flat and forms a die attach surface 820 onto which a die 830 comprising an evaluation circuit 810 is mounted. The evaluation circuit 810 is electrically coupled to the leadframe or, to be more precise, to the connecting sections 120 and the common connecting section 130 by three electrical connections 870-1, 870-2 and 870-3, respectively, which enable the evaluation circuit 810 to determine the voltage drops across the first and second resistive sections 110-1, 110-2. The electrical connections 870 are implemented as bond wires 890.

The evaluation circuit 810 may comprise electronic circuits to determine or measure the voltage drop over the resistive sections 110 working as current shunts and to convert the determined voltage drops to some output signal, which may, for instance, be a voltage, a current, another analog coded signal or a digitally coded bit stream. The electronic circuit is supplied with power via an electrical connection 870-4 and an electrical connection 870-5 which are also implemented as bond wires 890 in the embodiment shown here. The multiple current sensor device 800 further comprises two further electrical connections 870-6, 870-7, which are also implemented as bond wires 890 which enable the evaluation circuit 810 to provide the corresponding input or output signals to the printed circuit board 600. In other words, the electrical connections 870-6 and 870-7 make a connection to facilitate a transfer of the input or output signals to the further circuitry coupled to or implemented in the framework of the printed circuit board 600. To distinguish between the electrical connections 870-4, 870-5, 870-6 and 870-7 used to supply the evaluation circuit 810 with power and the ability to exchange signals, these electrical connections are also referred to as sensor terminals. In contrast, the electrical connections 870-1, 870-2 and 870-3, which are used to sense the voltage drop across the resistive sections 110, these electrical connections are also referred to as sense terminals.

To facilitate this, the leadframe 860 further comprises for each of the electrical connections 870-4 to 870-7 connecting areas 900 or bond pads, which are also electrically coupled to corresponding signal lines 910 of the printed circuit board 600. In other words, the connecting areas 900 may be small pins or lands soldered to fine PCB-traces serving as signal lines to provide the evaluation circuit 810 with electric power and to output signals of the sensor device 800.

In contrast, the electrical connections 870-1 to 870-3 connect input terminals of the evaluation circuit 810 to the current shunt resistor or, to be more precise, to the resistive sections 110 or rather the connecting sections 120 and the common connecting section 130.

Naturally, the electrical connection between the 870-3 between the common connecting section 130 and the die 820 of the evaluation circuit 810 may not only be used to sense the voltage drop across one or more of the resistive sections 110, but also to provide the evaluation circuit 810 with a reference or ground potential. This might lead to a slight reduction of the accuracy of the current determination, but a reliability of the device 800 may eventually increase. This reduced accuracy may be of lesser or even no importance, when the voltage drop across the resistive sections 110 is significantly larger (e.g. 100-times or more) than a voltage drop across the corresponding electrical connection 870-3 (ball or bond wire 890) due to the supply current for the evaluation circuit 810.

It is also possible, to use more than one electrical connection 870-3 between the current rails 135 and the evaluation circuit 810, for instance, to supply different parts of the evaluation circuit 810 with different supply signals. For instance, it might be advisable to use a different ground potential for the digital parts of circuitry of the evaluation circuit 810 than for other parts. For instance, the digital part may be provided with the ground potential by electrically coupling the digital part by a dedicated bond wire to the current rails 135. The ground potential for the part of the evaluation circuit 810 used to determine the currents may be provided to the evaluation circuit 810 by another dedicated bond wire coupled to the current rails 135. This may reduce interferences and disturbances due to current peaks, when digital parts of the evaluation circuit 810 switch. By using more than one bond wire 870, a coupling between connecting paths for the ground potential may be reducible.

FIG. 12 shows a similar perspective view of the multiple current sensor device 800 shown in FIG. 11 with a mold compound 920 added. The mold compound 920 protects the resistive sections 110, the electrical connections 870 and the evaluation circuit 810 and its die 830 from mechanical damage and makes the multiple current sensor device 800 easier to handle.

FIG. 13 shows a perspective view of a multiple current sensor device 800 shown in FIGS. 11 and 12 from the back side to be brought into contact with a printed circuit board 600. The multiple current sensor device 800 comprises the mold compound 920 covering in the embodiment shown the die 830 along with the evaluation circuit 810, which are both not shown in FIG. 13, and parts of the leadframe 860. However, the parts of the leadframe 860 to establish the electrical contact with the signal lines 910, the current lines 610 and the common current lines 620 are left uncovered by the mold compound 920. Accordingly, the back side of the multiple current sensor device 800 shown in FIG. 13 comprises the connecting areas 930 corresponding to the first and second connecting sections 120-1, 120-2, the common connecting section 130 and coupling areas 930. The connecting areas 900 allow supplying the evaluation circuit 810 with the necessary supply signals for operation and a signal exchange via the signal lines 910. To be able to establish this electrical contact, the leadframe 860 comprises the connecting areas 900, which are configured to electrically couple the multiple current sensor device 800 to external signal lines. The external signal lines comprise, for instance, the current lines 610, the common current lines 620 and the signal lines 910 of the printed circuit board 600.

Figure 14:
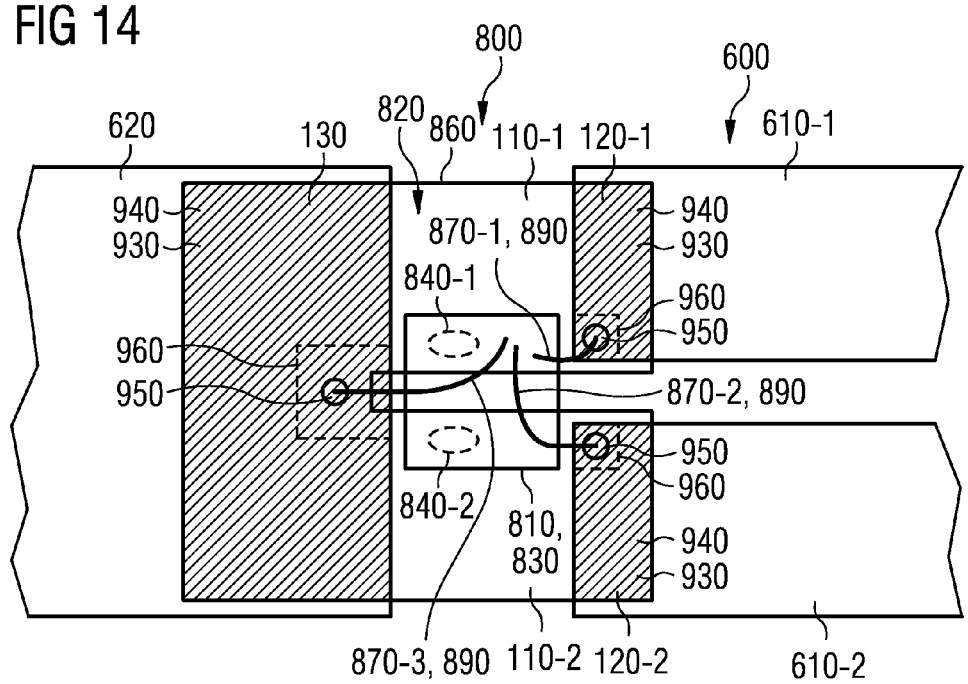
FIG. 14 shows a schematic plan view of a multiple current sensor device according to an embodiment.

FIG. 14 shows a plan view of a printed circuit board 600 along with a multiple current sensor device 800 according to an embodiment. The multiple current sensor device 800 is implemented as a double current sensor device 800 comprising a first resistive section 110-1, a second resistive section 110-2, a first connecting section 120-1, a second connecting section 120-2 and a common connecting section 130. The resistive sections 110, the connecting sections 120 and the common connecting section 130 are all implemented as part of the leadframe 860, which comprises a flat or plane die attach surface 820 on which a die 830 comprising an evaluation circuit is mounted. As outlined before, the evaluation circuit 810 comprises a first temperature sensor 840 located along a projection line perpendicular to the die attach surface 820 above the first resistive section 110-1 and a second temperature sensor 840-2 locate along a projection line perpendicular to the die attach surface 820 above the second resistive section 110-2. The first connecting section 120-1 is electrically coupled to a first current line 610-1 of the printed circuit board, while the second connecting section 120-2 is electrically coupled to a second current line 610-2 of the printed circuit board 600. Accordingly, the common connecting section 130 is coupled to a common current line 620 of the printed circuit board. To enable the multiple current sensor device 800 according to an embodiment to be electrically coupled to the respective current lines 610, 620, the multiple current sensor device 800 comprises coupling areas 930 which are configured to couple the multiple current sensor device 800 electrically to an external current trace, such as the previously mentioned current lines 610, the common current line 620 and signal lines as discussed earlier. In these areas the current supplied to or from the current lines 610 and extracted or supplied to the common current line 620 can be distributed inside the respective current lines 610, 620 before entering the connecting sections 120. Furthermore, the current can also be distributed inside the connecting sections 120, 130, before entering the resistive sections. Typically these coupling areas are soldered to the PCB-traces. Thereby the size of the coupling area must be large enough for the rated current so that the current density through the solder does not exceed approximately 20 A/mm$^2$, otherwise the solder may disintegrate over lifetime due to too high current density.

As a consequence, a voltage drop caused by the distributed currents inside the current lines 610, and the common current line 620 in the area covered by the coupling areas 930, and in the connecting sections 120 and the common connecting section 130 in the areas of the coupling areas 930 is typically smaller than in the resistive sections 110. Therefore, in a multiple current sensor device 800 according to an embodiment the evaluation circuit 810 may be electrically coupled to the resistive sections 110 in connecting areas 940, which are a projection along one or more projection lines perpendicular to the die attach surface 820, in order to tap the potentials at or in the vicinity of the resistive sections 110 to determine the corresponding voltage drops. Therefore, in the embodiment shown in FIG. 14 attention is paid to the specific locations of the electrical connections 870-1, 870-2, 870-3 connecting the input terminals of the electric circuitry of the evaluation circuit 810 to the resistive sections 110 acting as the current shunt resistors. The electrical connections 870-1, 870-2, 870-3 are implemented as bond wires 890 in the embodiment illustrated here.

In other words, in the multiple current sensor device 800 shown in FIG. 14, the evaluation circuit 810 is electrically coupled to the at least two resistive sections 110 in at least one connecting area 940 by at least one electrical connection 870 leaving the die 830 of the evaluation circuit 810. The at least one connecting area 940 is a projection area of a coupling area 930 of the multi-current sensor device 800 and configured to couple the multi-current sensor device 800 electrically to the previously mentioned external current traces. In the embodiment shown in FIG. 14, the bond wires 890 tap the potentials at or in the vicinity of the resistive sections 110 acting as current shunts marked in spots 950 marked as small circles. It may be advisable to tap the potential at the first connecting section 120-1 near its lower left corner in the illustration of FIG. 14, while it might be advisable to tap the potential of the second connecting section 120-2 near its upper left corner. In terms of a common connecting section 130, it might be advisable to tap that potential near the midpoint of its right edge as illustrated by the corresponding spot 950. These are the same or similar locations, where the sense lines 640 and the common sense lines 640 tap the voltages of the connecting sections 120 and the common connecting section 130, respectively, in the embodiment of a multiple current shunt device 100 according to an embodiment as shown in FIG. 6. These locations may be most robust against a spread due to changes in geometry of the current traces (current lines 610, common current line 620) or placement tolerances of a sensor package (multiple current sensor device 800) on the printed circuit board 600 or with respect to tolerances in the solder joints used to electrically couple the multiple current sensor device 800 to the printed circuit board 600 and its signal lines.

As outlined before, the bond wires 890 contact the leadframe 860 of the multiple current sensor device 800, which is also referred to as current shunt current sensor, but since the leadframe 860 is typically thin, with thicknesses of, for instance, around 0.2 mm. As a consequence, it might be simpler for the PCB-designer since designing and implementing this thin voltage sense lines, the sense lines 630 and the common sense line 640, may be ommitable.

In other words, in the embodiment shown in FIG. 14, the evaluation circuit 810 is electrically coupled to the at least two resistive sections 110 in square sub-regions 960 of the connecting areas 940 completely comprised in the connecting areas 940. The square sub-sections have a width of at most 50% of a smallest characteristic length of the connecting area 940 parallel to the die attach surface 820 and being located closest to the evaluation circuit 810 inside the connecting areas 940. The same is also true for the common connecting section 130 and its connecting area 940. However, in other embodiments, the square sub-region 960 may comprise a width of at most 40%, at most 30%, at most 25% or at most 20% of a smallest characteristic length of a connecting area 940 parallel to the die attach surface 820. The square sub-regions 960, irrespective of their actual size, are, in other words, fully embedded in the respective connecting areas 940.

However, before continuing to describe this and further embodiments of a multiple current sensor device 800, it should be noted that the connecting areas 940 may also be a projection area of at least one of the resistive sections 110 and the at least one connecting section 120. This may, for instance, be the case in a multi-layer multiple current sensor device 800 based on a layered multiple current shunt device 100 according to an embodiment or a similar multi-current sensor device 800. In other words, the connecting areas 940 may be given by an arrangement of the connecting sections 120 and the resistive sections 110 being partially stacked as, for instance, shown in the case of the multi-current shunt device 100 according to an embodiment in FIGS. 8 and 9.

Returning to the embodiment shown in FIG. 14, the leadframe 860 may be, for instance, identical to the one typically used for a conventional plastic encapsulated electronic package. To this end the die paddle may be split into parts or branches comprising the resistive sections 110-1, 110-2, respectively, along with their respective connecting sections 120-1, 120-2, respectively, through which the two currents I15 and I15' flow.

Since this leadframe 860 is typically made of simple copper or highly pure copper, it has a large temperature dependence of about 0.4% of a degree centigrade (0.4%/° C.). This may mean that a temperature increase of only 5° C. increases the resistance by about 2%. This might lead to a 2% error or uncertainty in the estimation of the current, if the temperature dependence of the current shunt material (the material of the resistive sections 110) would not be accounted for.

To account for the temperature dependencies, the centered die 830 may be attached to the resistive sections 110, which essentially determine the resistance of the two current shunts Rsh15 and Rsh15'. Since the sensor die 830 may be brought into an intimate thermal contact with the resistive sections 110, it may be possible for the evaluation circuit 810 to sense the temperature of these parts. In the embodiment shown in FIG. 14, for this reason at least two temperature sensors 840-1, 840-2 have been implemented in the spots indicated in FIG. 14. They are capable of determining or feeling the temperature of the resistive sections 110-1, 110-2, respectively, and the evaluation circuit 810 may use these measured temperature values to compensate for temperature dependence of their resistance. Implementing one or more temperature sensors 840 may, therefore, improve the accuracy of the system vs. temperature. However, the temperature sensors 840 should not be placed too close to the bond paths or connection areas on the die 830 of the evaluation circuit 810 because the bond wires 890 or other electrical contacts 870 leaving the die 830 might draw heat into or out of the die 830 via the bond wires 890 or other electrical connections 870. However, it may be admissible to use only one temperature sensor 840, which may, for instance, be placed between the two indicated areas in FIG. 14 for the temperature sensors 840. This may simplify the evaluation circuit 810 and still render a sufficient accuracy if, for instance, the temperature difference between the resistive sections 110-1, 110-2 is low enough. This may, for instance, be partly determined by the geometry of the resistive sections 110 or other geometrical parameters of the current shunt and, partly, by a ratio of the currents I15 and I15' flowing through the resistive sections 110-1, 110-2, respectively, and the required accuracy of the current measurement.

Using a single material, for instance copper, for both the resistive sections 110 and the connecting sections 120 and the common connecting section 130, a multiple current sensor device 800 may have a smaller power dissipation at low and room temperature than traditional alloy-based current shunts, because the resistance of this current shunt may be smaller. However, at high temperatures, the resistance may increase to a value comparable to that of alloy-based current shunts. Therefore, multiple current sensor devices 800 may save power in typical applications, where temperature is not too high.

To improve the thermal contact between the temperature sensors 840 and the resistive sections 110, it may be advantageous to grind the die 830 to smaller thicknesses of at most 200 µm, for instance to a thickness of 50 µm. This may improve the thermal contact between the circuit elements of the evaluation circuit 810 on a surface of the die 830 and the resistive sections 110 (current shunt parts) of the multiple current sensor device 800. It may also reduce thermal crosstalk between a temperature sensor associated to a first resistive section and other resistive sections. Moreover, a thin die 830 might be more flexible than a thick one, which can render the multiple current sensor device 800 according to an embodiment more robust against strain caused by thermal shocks during overcurrent events.

Figure 15:
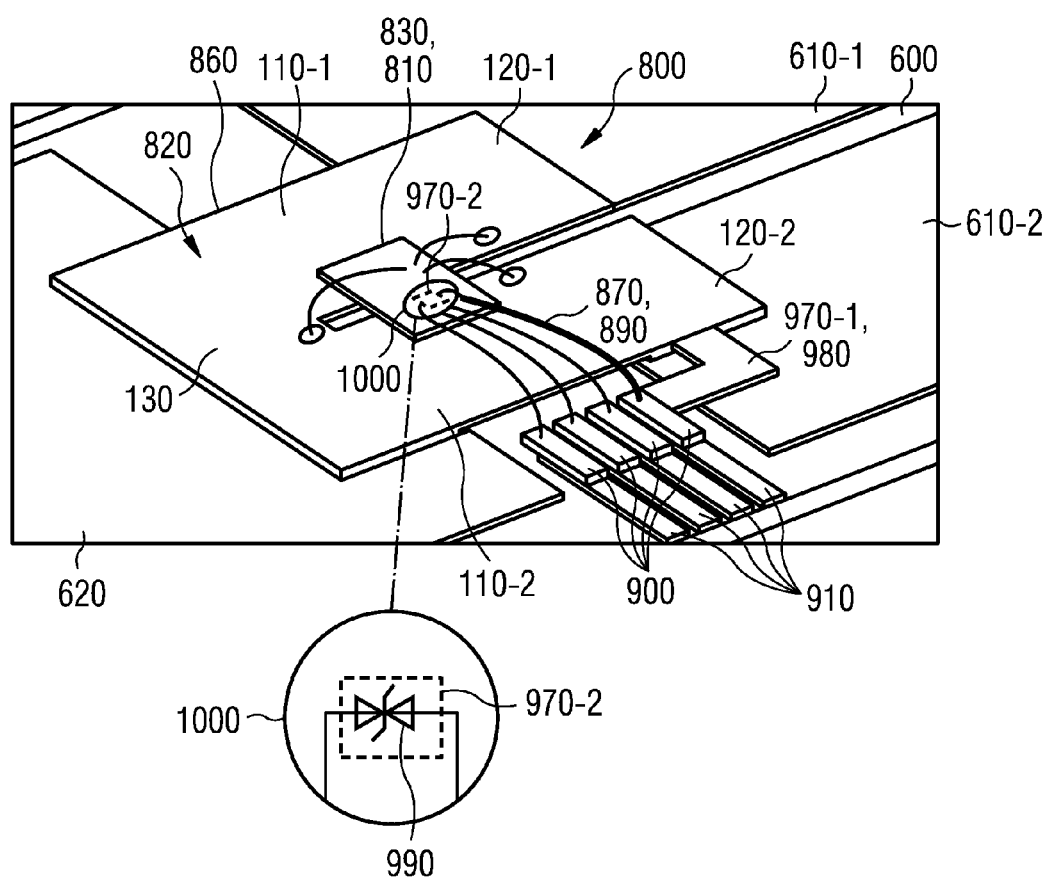
FIG. 15 shows a perspective view of a multiple current sensor device according to an embodiment comprising an electrostatic discharge protected circuit.

FIG. 15 shows a perspective view of a multiple current sensor device 800 according to an embodiment, similar to FIG. 11. Therefore, reference is made to the description of FIG. 11. However, the multiple current sensor device 800 as shown in FIG. 15 differs from that shown in FIG. 11 with respect to some aspects, which will be described next.

For instance, it may be advantageous to protect the input terminals of the evaluation circuit 810 with electrostatic discharge diodes, which are also referred to as ESD-diodes, or similar electrostatic discharge protective circuits. The multiple current sensor device 800 as shown in FIG. 15 comprises a first electrostatic discharge protective circuit 970-1, which is configured to protect the evaluation circuit 810 from damage due to an electrostatic discharge. In other words, the electrostatic discharge protection circuit 970-1 is configured to reduce a probability of a damage to the evaluation circuit 810 due to an electrostatic discharge.

In the embodiment shown in FIG. 15, the electrical conductive connection 980 electrically couples one of the connecting areas 900 on the leadframe 860 to the second connecting section 120-2. The respective connecting area 900, which is also coupled to the evaluation circuit 810 may, for instance, be used to supply the evaluation circuit 810 with the ground potential or another reference potential by the electrical connection 870, which may once again be implemented as a bond wire 890. When a charge is accidently applied to the ground pin of the evaluation circuit 810, it may flow to any other signal pin of the evaluation circuit 810 via the ESD-devices, which are commonly connected between any external pin of the evaluation circuit and the ground potential. Yet this charge does not generate a large voltage between the sense inputs 870 of the evaluation circuit 810 and the sensor ground node. Due to the finite length of the wires and their associated impedance, a certain voltage may still be generated at the sense wires against ground, but this often only requires small ESD-devices there. These smaller ESD-devices typically comprise smaller parasitic effects, such as leakage currents and stray capacitances, that may impair the accuracy of the multiple current sensor device 800. As a consequence, when an electrostatic charge is accidentally provided to the respective connecting area 900 of the multiple current sensor device 800, the charges may be redistributed to the connecting section 120-2 and via the electrically coupled second resistive section 110-2, the common connecting section 130, the first resistive section 110-1, also to the first connecting section 120-1. It may be, therefore, advantageous to connect, for instance, the ground pin of the multiple current sensor device 800 with larger parts such as the resistive sections 110, the connecting sections 120 and the common connecting section 130 of the multiple current sensor device 800. This may be done by readily joining one of the small pins or lands (connecting area 900) with, for instance, the second connecting section 120, as shown in FIG. 15.

Figure 16:
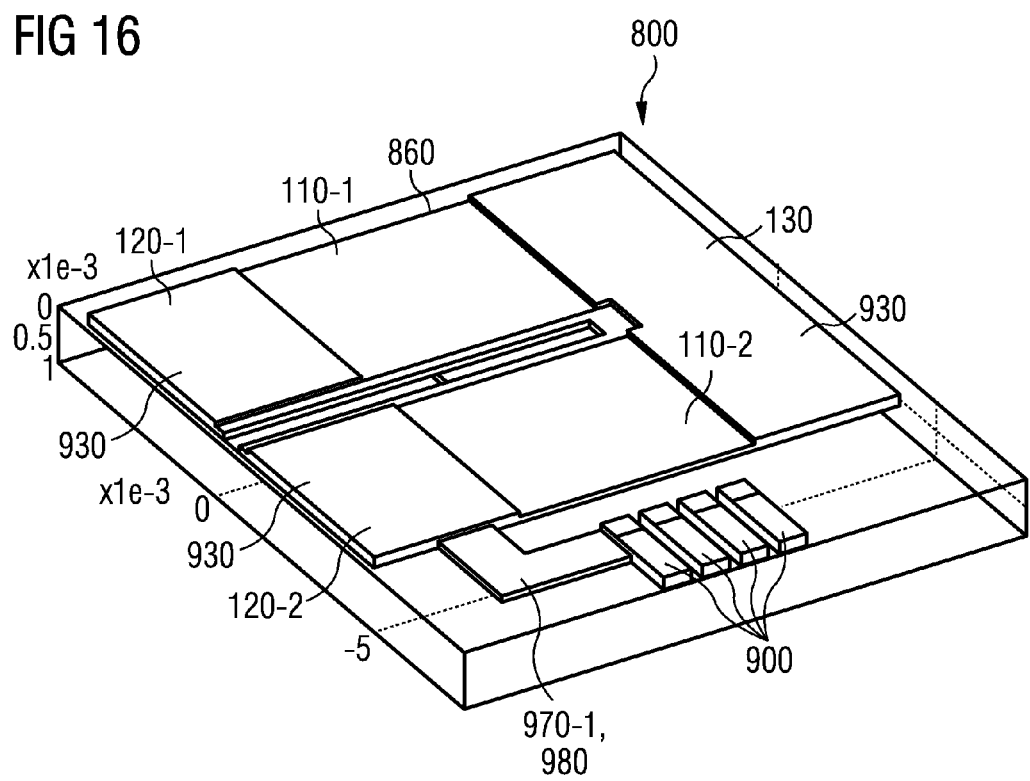
FIG. 16 shows a perspective bottom view of a leadframe of the multiple current sensor device according to an embodiment shown in FIG. 15.

FIG. 16 shows a corresponding perspective bottom view of the leadframe 860 of the multiple current sensor device 800 of FIG. 15. Once again, the leadframe 860 is fabricated from a single material, wherein the resistive sections 110 comprise a smaller thickness perpendicular to the die attach surface 820 of the evaluation circuit 810 than the connecting sections 120 and the common connecting section 130. The electrically conductive connection 980 is coupled to the connecting area 900 of the leadframe 860, however, it is not in contact with the surface of the printed circuit board 600 (not shown in FIG. 16). To be more precise, in the embodiment shown in FIGS. 15 and 16, half of its thickness it etched away such that the electrically conductive connection 980 is covered by the mold compound 920 (not shown in FIGS. 15 and 16) to electrically insulate the electrically conductive connection 980 from other parts of the printed circuit board 600 or the like. In other words, in the embodiment shown in FIGS. 15 and 16, the electrically conductive connection 980 comprises a surface parallel to that of the die attach surface 820. This, however, may be implemented differently in other embodiments.

The electrically conductive connection 980 joining the second connecting section 120-2 and the respective connecting area 900 of the leadframe 860 is also referred to as branch. As outlined before, this connecting area 900 may, for instance, be used as a ground pin for the evaluation circuit 810 of a sensor circuit. Naturally, in other embodiments, the bridge or electrically conductive connection 980 may also join any other connecting area 900. Moreover, instead of connecting the second connecting section 120-2, any other connecting section 120, a resistive section 110 or the common connecting section 130 may be electrically connected. For instance, by electrically connecting the ground pin or connecting area 900 for the reference potential of the evaluation circuit 810 with a common connecting section 130 may even yield a better accuracy by electrically coupling the common connecting section 130 with the ground terminal of the evaluation circuit 810 to form a system-wide ground terminal.

The idea behind joining the ground pin (connecting area 900) with any of the previously mentioned sections of a current shunt is to protect the sensitive input terminals of the evaluation circuit 810 connected by bond wires 890 or other electrical connections 870 even if the package is not soldered to the printed circuit board 600. For instance, by accidentally injecting charge into the respective connecting area 900, no or only a small amount of charge is injected into the sensitive input terminals of the evaluation circuit 810, because any charge applied to any of the respective leadframe parts will be more or less evenly distributed over the leadframe 860, so that larger voltages are being prevented from building up between the input terminals of the evaluation circuit 810 and ground potential of the circuit on a die 830.

To illustrate this further, suppose the contrary case, if, for instance, the respective connecting area 900 would not be joined up to the second connecting section 120-2 or any other part of the leadframe 860 having a good electrical connection to the current shunt parts thereof. If, for instance, someone handles the device and touches parts of the coupling areas 930 of the leadframe 860 while being charged up, this charge might flow from the connecting section 120-2 via the electrical connections 870 to the sensitive input terminals of the evaluation circuit 810, via parts of this circuit further bond wires 890 to the connecting area 900. Thereby, the sensitive input terminals, which may, for instance, be coupled to or comprise gates of metal-oxide-semiconductor transistors or the like (MOS transistors), might be blown or might be partially damaged. Therefore, by joining the current shunt paths of the multiple current sensor device 800 as described before with the ground pin or connecting area 900 might greatly improve the electrostatic discharge hardness of the multiple current sensor device 800 to such an extent that the bond paths of the bond wires 890 may not need any ESD-devices or diodes at all, or only small ESD-diodes or similar devices and circuits. This might improve the performance of the circuitry, since large ESD-devices are often accompanied by large parasitics like high temperature leakage currents or stray capacitances.

Naturally, instead of using the bridge-like or branch-like structure shown in FIGS. 15 and 16, it is also possible to use, for instance, a dedicated bond wire that connects any of the resistive sections 110, the connecting sections 120 and the common connecting section 130, the so-called current shunt paths of the multiple current sensor device 800, with the ground pin or pad of the evaluation circuit 810 (ground pad) or the corresponding connecting area 900 of the multiple current sensor device 800. In order to save a signal pin or land, it might be possible to connect the ground pad with any of the current shunt paths (resistive sections 110, connecting sections 120 and common connecting section 130), for instance, the common connecting section 130.

The multiple current sensor device 800 shown in FIG. 15 further comprises a second electrostatic protective circuit 970-2, which may be alternatively or additionally implemented to the electrostatic protective circuit 970-1. The electrostatic discharge protective circuit 970-2 is implemented on the die 830 of the evaluation circuit 810 or, to be more precise, in the framework of the evaluation circuit 810. It comprises an electrostatic discharge protective diode or ESD-diode 990 as shown in the blown up part 1000 of FIG. 15. The ESD-diode 990 may, for instance, be coupled in between sensitive input terminals or sensitive output terminals of the evaluation circuit 810 and the terminal for the ground potential, which may be coupled to the corresponding connecting area 900 by a corresponding electrical connection 870, for instance, a bond wire 890.

Apart from FIG. 1, so far only essentially U-shaped configurations of multiple current sensor devices 800 and multiple current shunt devices 100 have been shown. Naturally, as indicated earlier, also other configurations, for instance W-configurations, V-configurations or I-configurations may easily be implemented. For instance, in the case of the I-configuration the current shunt paths may, for instance, be lined up along an extension line comprising, in that order, the first connecting section 120-1, the first resistive section 110-1, the common connecting section 130, the second resistive section 110-2 and the second connecting section 120-2. Naturally, also the inverse order may as well be implemented in the case of an I-configuration. Two or more I-configurations may also be implemented by using a common common connecting section 130, wherein the cross-like structure comprises more than one I-configuration.

In the case of a multiple current shunt device 100, which may comprise alloy-based resistive sections 110, or multiple current sensor devices 800 with, for instance, alloy-based resistive sections 110 without temperature sensors 840, such an implementation may work well. However, in such a configuration the common connecting section 130 is located in the center of the structure and, therefore, the devices 100, 800 may be larger than U-type devices, since the current traces that electrically connect the connecting sections 120 and the common connecting section 130 into the remaining circuitry, may have to be chosen and designed wide enough for the appropriate currents to be provided to the multiple current shunt device 100 or the multiple current sensor device 800 according to embodiments. For instance, in the case the multiple current shunt devices 100 and the multiple current sensor devices 800 are soldered to the respective printed circuit boards 600, due to electromigration it might be advisable to limit a current density at the coupling areas 930 of the respective devices 100, 800.

In the case of, for instance, pure copper current shunts, it might be advisable to implement temperature sensors 840. In this case, an I-configuration might face another challenge. The two resistive sections 110-1, 110-2 may not be direct neighbors, so that it might be difficult to place a die 830 comprising the temperature sensors 840 on top of both. In this case it might be advisable to implement two different dies 830 and place one above the first resistive section 110-1 and one above the second resistive section 110-2. Then the two dies 830 or rather their evaluation circuits 810 and their temperature sensors 840 may have to communicate to, for instance, provide one of the evaluation circuits 810 with temperature data or temperature signals from the temperature sensor 840 associated with the other die 830. This might present an additional challenge for a practical implementation. Such an embodiment may be interesting when large currents are to be determined, such as currents exceeding several hundred ampere (e.g. 1000 A and above). In such a case, the resistive sections 110 may become comparably large so that individual dies 830 for each of the resistive sections 110 may be interesting to implement. The circuits of dies 830 may then coordinate their respective signals to provide the sensor signal.

Moreover, it is worth mentioning that a further die 830 comprising an evaluation circuit 810, which may, for instance, be attached to the common connecting section 130 may be implemented and isolated against all other parts via a thin isolation platelet between the respective die and the corresponding part of the multiple current sensor device 800. This die may, for instance, comprise a coreless transformer circuit that receives data from the evaluation circuit 810 or die 830 attached to the resistive sections 110-1, 110-2 in a galvanically isolated manner. The evaluation circuit may then output this data to one or more of the connecting areas, in other words, to one of the pins of the multiple current sensor device 800. Coreless transformers, $\Sigma$-$\Delta$-based analog/digital convertors (ADC) may be implemented. The die 830 may, for instance, be a silicon die (Si).

FIG. 17 shows a plan view of a further embodiment of a multiple current sensor device 800 according to an embodiment. The multiple current sensor device 800 as shown in FIG. 17 is based on a leadframe 860 on the basis of which the connecting sections 120-1, 120-2, the resistive sections 110-1, 110-2 and the common connecting section 130 are formed. Moreover, the multiple current sensor device 800 further comprises five connecting areas 900 which have been implemented as part of the leadframe 860 but which have been electrically decoupled from the rest of the leadframe during manufacturing. The connecting areas 900 are coupled to the evaluation circuit 810, the die 830 of which is mounted onto a plane die attach surface 820 formed at least partially on top of the resistive sections 110 of the multiple current sensor device 800. The evaluation circuit 810 is coupled to the connecting areas 900 as well as to the resistive sections 110—or rather the connecting sections 120 and the common connecting section 130—by electrical contacts 870 leaving the die 830 of the evaluation circuit 810, which are implemented as bond wires 890 here. The bond wires 890 are coupled to the evaluation circuit to areas 880-1, 880-2, which are symmetrically arranged with respect to a symmetry plane 160, the resistive sections 110-1, 110-2 are also symmetrically arranged with respect to. Electrical connections 870-1, 870-2, 870-3 coupling the evaluation circuit 810 to the resistive sections 110 are also referred to as sense wires.

The evaluation circuit 810 further comprises a first temperature sensor 840-1 and a second temperature sensor 840-2 associated and placed above the first resistive section 110-1 and the second resistive section 110-2, respectively. The multiple current sensor device 800 further comprises a mold compound 920, which covers the evaluation circuit 810 and the die 830 along with parts of the leadframe 860. However, to electrically couple the connecting areas 900 as well as the connecting sections 120 and the common connecting section 130, the coupling areas 930 are once again left uncovered by the mold compound 920.

While the leadframe 860 comprises a common surface forming the die attach surface 820 on top of which the die 830 of the evaluation circuit 810 is placed, the leadframe 860 comprises a thickness perpendicular to the die attach surface 820 in the areas of the common connecting section 130 and the connecting sections 120-1, 120-2 of approximately 0.2 mm thickness. In contrast, the thickness of the leadframe 860 is reduced to about 0.1 mm thickness in the resistive sections 110 (e.g. by half-etching). To illustrate possible dimensions of the multiple current sensor device 800 according to an embodiment, a length L and a width W as well as parts of the length $L_1, \ldots, L_5$ and corresponding widths $W_1$, $W_2$ and $W_3$ will be discussed next. However, it should be noted that the sizes of multiple current sensor devices 800 may be chosen differently from those discussed next. As will be outlined below, the dimensions given merely represent one possibility to implement a multiple current sensor device 800 according to an embodiment which might be able to withstand currents of up to 50 A.

The multiple current sensor device 800 as shown in FIG. 17 comprises a length L of about 5.2 mm and a total width W of about 4.9 mm. The coupling areas 930 associated with the first and second connecting sections 120-1, 120-2 each comprise a length $L_1$, $L_3$ of about 2 mm and a corresponding width $W_3$ of 1.5 mm. A gap 1010, which is also filled with a mold compound 920, comprises a length $L_2$ of about 0.2 mm. The coupling area 930 associated with the common connecting section 130 comprises length of about 4.2 mm and width $W_1$ of about 0.8 mm and, hence, an area of about 4.2 mm·0.8 mm=3.36 mm², while the coupling areas 930 associated with the two connecting sections 120-1, 120-2 each comprise an area of 1.5 mm·2 mm=3 mm² at the opposite side of the multiple current sensor device 800.

Depending on the concrete implementation of the details of a multiple current sensor device 800 according to an embodiment, these areas may be sufficient so that solder joints can even withstand 50 A over a temperature lifetime, which may be limited by electromigration.

A width $W_2$ of the resistive sections 110 is about 2.6 mm long. Accordingly, the die attach surface 820 gives enough room for a die 830 of 2.2 mm·3.8 mm as shown in FIG. 17. The contact areas 900 each comprise a length $L_5$ of about 0.7 mm, separated from the second resistive section 110-2 by a length $L_4$ of about 0.3 mm.

The leadframe is about 0.2 mm thick in the areas of the contacts, in other words in the coupling areas 930. At the resistive sections 110 it is half-etched down to about 0.1 mm thickness from the bottom side, so that the top of the leadframe is plane and therefore apt for the die 830 to be attached onto the die attach surface 820 formed accordingly.

The maximum die size is illustrated in FIG. 17 and approximately 2.2 mm wide and 3.8 mm long, giving a total area of about 8.4 mm². It may be limited with respect to the common connecting section 130 and with respect to the connecting sections 120 by the areas 880-1, 880-2 for the electrical contacts 870-1, 870-2, 870-3 used to electrically couple the evaluation circuit 810 to the resistive sections 110. In other words, if the die 830 were wider, it might obstruct the places or spots 950 for the sense wires on the leadframe 860 indicated by the three circles.

The resistive sections 110 are each 2.6 mm wide ($W_2$) and 2 mm long ($L_1$, $L_3$) and 0.1 mm thick, which gives a resistance of about 230 µΩ for each one if they are made of copper with a resistivity of about 57 µΩ/mm². At a current of 50 A, a voltage drop detected by the sense wires 870-1, 870-2, 870-3 of about 11.5 mV and a dissipated energy of about 0.6 W might be present. The footprint or total size of the multiple current sensor device 800 according to an embodiment of a total package may be about 5.2 mm·4.9 mm as outlined before. Its thickness could be as low as about 0.6 mm.

However, the dimensions, material specific parameters and other operational parameters are given as an example only. Multiple current sensor devices 800 as well as multiple current shunt devices 100 according to embodiments are by far not limited to these data.

At the bottom of the multiple current sensor device 800 shown in FIG. 17, small lands or connecting areas 900 are shown. Two of the five connecting areas 900 may, for instance, be used to supply the silicon die 830 with electric power and the other three might be used as signal terminals, for instance, for a digital interface to provide information on the measured currents.

The positions of the electrical contacts 870 leaving the die 830 are shown in FIG. 17 by areas 880-1, 880-2, which are symmetrically arranged with respect to the symmetry plane 160. These places for the bond pads of the bond wires 890 are roughly located in between the two temperature sensors 840-1, 840-2. Since there is a gap 1010 in the leadframe 860 between the two resistive sections 110, it might be better not to have the bond pads above this unsupported part of the die 830. Therefore, it might be advisable to distribute the areas 880 of the bond pads to both sides of this gap 1010 so that a heat flow through the bond wires 890 has a similar effect on both temperature sensors 840. This, for instance, may be achieved if the lengths, the diameters and the thermal conductivities of the bond wires 890 and the positions or areas 880 of the bond pads are arranged in such a way that the heat flowing through the bond wires 890 causes essentially identical temperature shifts on both temperature sensors 840-1, 840-2. In other words, the temperature sensors 840 are located on isothermal lines of the multiple current sensor device 800.

If all wires were equally long and thick and of equal material, the center of gravity of their bond pads would be located on the symmetry plane 160 indicated by the broken line. Four bond wires 890 comprising the three sense wires 870-1, 870-2, 870-3 as well as one bond wire 890 coupling a connecting area 900 to the evaluation circuit 810 have bond pads inside the dashed upper elliptical area 880-1, while the other four bond wires 890 have bond pads inside the dashed lower elliptical area 880-2. In the embodiment shown in FIG. 17, both elliptical areas 880-1, 880-2 and both temperature sensors 840-1, 840-2 are mirror symmetric with respect to the symmetry plane 160 indicated by the dashed horizontal line. This arrangement of the areas 880 and the temperature sensors 840 is an optional feature that might be implemented in this and in other embodiments. However, it is by far not required.

In embodiments of a multiple current sensor device 800 it may be important, sometimes even vital, to minimize the number of signal lines for low-cost applications, because each signal line needs space on the printed circuit board 600, where the multiple current sensor device 800 and its sensor package is soldered too. A conventional single current shunt can operate with two sense lines for the voltage determination only.

FIG. 18 shows a further embodiment of a multiple current sensor device 800 according to an embodiment, which comprises structures for the current to be directed underneath the die 830. To be more precise, the leadframe 860 of the multiple current sensor device 800 as shown in FIG. 18 comprises a first slot 1020-1 and a second slot 1020-2, which are aligned along a common line and restrict an interface area between the resistive sections 110 and the associated connecting sections 120. In other words, the first slot 1020-1 reduces an interface area between the first resistive section 110-1 and its associated connecting section 120-1 by a factor of more than 1.5. For instance, in the embodiment shown in FIG. 18, the slot 1020-1 restricts the interface area between the resistive section 110-1 and its associated connecting section 120-1 by more a factor of 2, more than a factor of 3. The same also applies to the second slot 1020-2, which is symmetrically arranged with respect to a symmetry plane 160. However, the slots 1020 are not required to be symmetrically implemented or to be present at all.

The intention of these two slots 1020 in the leadframe 860 is to make the sense voltages more robust against changes in the geometry of the electrical connections, which may be implemented as solder junctions to name just one example, and the respective PCB-traces or current lines 610, 620 of a printed circuit board 600. Additionally, it might be possible to increase the sense voltage at the cost of increased power dissipation. In such a case, it might be advisable to relocate the temperature sensors 840 such that they are shifted towards the constriction of the resistive parts 110 since these are the areas in which the temperature is likely to be maximum. Accordingly, also the bond pads or areas 880 might be advisable to be as large as possible to the temperature sensors 840 and to keep the symmetry with respect to the symmetry plane 160, if such as symmetry plane 160 is present.

However, by implementing the slots 1020 as shown in FIG. 18, maximum die size may be slightly reduced to 2 mm·3.8 mm, when, for instance, the slots 1020 have a width of about 0.2 mm compared to the embodiment shown in FIG. 17. This, however, is not required if, for instance, avoiding overlap of the die 830 and the additional slots 1020 in the leadframe 860 is not to be considered. Naturally, the slots 1020 may also be located inside the contacts or—in other words—in the connecting sections 120 limiting their coupling areas 930. Depending on the implementation of the evaluation circuit 810, it might be more advisable to restrict the die size in favor of implementing the slots 1020 as part of the resistive sections 110. Naturally, the slots 1020 may also be implemented as parts of both the connecting sections 120 and the resistive sections 110.

FIGS. 19, 20, 21 and 22 illustrate four perspective views of a printed circuit board 600 and a multiple current sensor device 800 according to an embodiment based on the so-called flip-chip assembly technique or flip-chip assembly style of a die 830. In other words, the die 830 of the evaluation circuit 810 may be at least partially mounted on the die attach surface 820 using a flip-chip mounting technique. In the flip-chip technique, electrical connections are made via at least one electrical connection 870 leaving the die 830 of the evaluation circuit 810 such that the at least one electrical connection 870 is coupled to the evaluation circuit 810 using at least one connection pad on the front side of the die 830. The at least one connection pad faces in the mounted position of the die 830 the die attach surface 820. Electrical connection may comprise at least one solder dot or another electrically conducting ball or structure.

As outlined before, the die 830 may be implemented notably smaller than the whole package of the multiple current sensor device 800. For instance, if one wants to reduce the size of the leadframe 860, one might be faced with the challenge that the die 830 overlaps the locations to be used for the sense wires electrically coupling the resistive sections 110 to the evaluation circuit 810. Therefore, using bond wires 890 to bond the respective parts of the leadframe 860 to the input terminals of the evaluation circuit 810 might be problematic. However, using a flip-chip technique might overcome this problem.

A multiple current sensor device 800 may also work with two terminals—apart from the contacts to provide the currents—only. For instance, the evaluation circuit 810 may be configured to determine at least two voltage drops across the at least two resistive sections 110 comprising a first voltage drop and a second voltage drop. The multiple current sensor device 800 may further comprise at least one terminal coupled to the evaluation circuit 810, wherein the evaluation circuit 810 and the at least one terminal are configured to perform at least two operations of a group of operations. The group of operations may, for instance, comprise supplying the evaluation circuit with a reference potential, supplying the evaluation circuit 810 with a supply signal, for instance, a supply voltage, receiving a control signal, providing an information-carrying signal indicative of or based on the first determined voltage drop, providing an information-carrying signal indicative of or based on the second determined voltage drop and receiving an information-carrying signal. In other words, a multiple current sensor device may use a terminal for several purposes.

To illustrate this, the negative supply terminal, for instance, used to provide the evaluation circuit 810 with a reference potential such as the ground potential, the die 830 may be connected to one of the connecting sections 120 or the common connecting section 130 for the primary current to be determined. In other words, the die 830 may receive its ground potential or other reference potential by providing an electrical contact to one of the connecting sections 120 or the common connecting section 130. In other words, going back to FIG. 17, the ground potential for the die 830 of the evaluation circuit 810 may be provided via the coupling area 930 of a common connecting section 130 having dimensions of 4.2 mm·0.8 mm. Then, the die 830 and the evaluation circuit 810 may only require one positive supply terminal and one signal terminal, which make only two terminals of the package except the large coupling areas 930 for the primary currents.

It should be noted that, with intelligent interface techniques, it might be possible to send the information concerning the at least two measured or determined currents with respect to both resistive sections 110 over a single terminal. In fact, one could even send this information via the positive supply terminal of the multiple current sensor device 800, for instance, by supply current modulation. In this case, it might be possible to implement a multiple current sensor device 800 with four terminals only, three for the primary currents plus a single terminal for the combined use of electrical supply of the evaluation circuit and signaling. Accordingly, it might be possible to save a lot of space on the printed circuit board 600 for signal traces, especially if the current sensor device 800 according to an embodiment is close to high-current paths of the circuit, while the microprocessor, to which the current readings of the sensor are to be delivered, is at a very distant point on the printed circuit board 600.

FIG. 19 shows a perspective view of a printed circuit board 600 comprising the first current line 610-1, the second current line 610-2, a common current line 620 along with a first signal line 910-1 and a second signal line 910-2. Moreover, FIG. 19 also illustrates a footprint 1030 of the multiple current sensor device 800 according to an embodiment. As can be seen, the footprint 1030 covers the previously mentioned signal lines or traces on the printed circuit board partially. Therefore, electrical contact can easily be made using the flip-chip technique. The footprint 1030 is a projection of a total size of the respective device, in the present case of the multiple current sensor device 800 according to an embodiment, onto the carrier or printed circuit board 600 in its mounted position.

In other words, FIG. 19 shows a layout of the PCB-traces with the current lines 610-1, 610-2 being the primary traces for the currents in, the common current line 620 being the trace for the primary currents out, and the signal line 910-1, for instance, the PCB-trace for the output signals of the evaluation circuit 810 on the die 830 (not shown in FIG. 19). The signal line 910-2 may be the PCB-trace of a positive supply voltage of the evaluation circuit 810 on the die 830.

FIG. 20 shows a perspective view of the printed circuit board shown in FIG. 19 with a leadframe 860 of the multiple current sensor device 800 soldered onto the respective traces or lines. To be more precise, the leadframe 860 is soldered onto the current lines 610-1, 610-2, the common current line 620 and the two signal lines 910-1, 910-2. As previously described, the leadframe 860 comprises the first and second connecting sections 120-1, 120-2, the first and second resistive sections 110-1, 110-2, the common connecting section 130 and two connecting areas 900-1, 900-2 to be electrically connectable to the two signal lines 910-1, 910-2.

Apart from the leadframe 860, FIG. 20 also shows a total number of seven electrical connections 870, . . . , 870-7, which are implemented as balls 1040 or bumps. The balls 1040 allow the evaluation circuit 810 (not shown in FIG. 20) to make contact to parts of the leadframe 860.

The bumps 1040 corresponding to the electrical connections 870-1, 870-2 and 870-3 establish the electrical contact to the first connecting section 120-1, the second connecting section 120-2 and the common connecting section 130, respectively, and therefore allowing the evaluation circuit 810 to be electrically coupled to the resistive sections 110-1, 110-2. As outlined before, the resistive sections 110-1, 110-2 comprise a smaller thickness with respect to the die attach surface 820. In other words, the three balls corresponding to the electrical connections 870-1, 870-2 and 870-3 establish the sense contact, wherein the electrical contact 870-3 senses the common potential of the common connecting section 130, while the other two electrical connections 870-1, 870-2 sense the voltage drop over the respective resistive sections 110-1, 110-2, respectively.

The electrical connections 870-4, 870-5 making contact to the common connecting section 130 provide the evaluation circuit 810 with the reference or ground potential. For mechanical reasons in the embodiment shown in FIG. 20 two balls 1040 have been used to improve the mechanical stability over a single ball 1040. The balls 1040 representing the electrical connections 870-6 and 870-7 make electrical contact between the connecting areas 900-1 and 900-2, which are also referred to as lands, respectively, to allow the evaluation circuit to be provided with the positive supply voltage and to establish a connection with the external circuitry.

FIG. 21 shows a perspective view of the printed circuit board 600 along with the leadframe 860 and the die 830 comprising the evaluation circuit 810 being mounted onto the leadframe 860 using the flip-chip technique. In other words, the die 830 rests on the bumps or balls 1040 shown in FIG. 20. The die 830 is upside down, while the underfill between the die 830 and the leadframe 860 is not shown for clarity reasons. To provide a good thermal coupling between the die 830 and the leadframe 860 in the case of the flip-chip technique, it might be advisable to choose the underfill such that it comprises a high or even maximum thermal conductivity. Bumps or balls 1040 may also be used as heat bridges. It might be possible, for instance, to implement more balls 1040 than necessary for the pure electrical connection. By implementing more balls or bumps 1040 it might be possible to improve the thermal coupling of the die 830 to the hotspots of the current rails comprising the resistive sections 110.

It might be advisable to implement a ball or bump 1040 directly underneath one of the temperature sensors 840 so that the temperature of the respective current rail can be transferred to the temperature sensor 840 via the bump 1040. This bump can, for instance, be located close to the hottest spot on the current rail. Moreover, the temperature sensor 840 can be galvanically isolated from the bump 1040 and, accordingly, from the current rail comprising the resistive sections 110, by implementing a thin outside layer between the top metal layer and the surface of the die 830 comprising the bump and the actual temperature sensor, which may, for instance, be implemented as a p-n-junction as outlined before. It might be advisable to further implement an electric shielding between the respective pad and the temperature sensor 840 by, for instance, implementing a galvanically isolated, but grounded metal layer between the pad and the temperature sensor or a corresponding metal grid to prevent disturbing capacitive charging and discharging currents caused by abrupt changes in the voltages in the high current paths from being coupled into the die 830 and its evaluation circuit 810.

Moreover, it might be advisable to place corresponding bumps or balls 1040 close to heat sources on the die 830 to allow their heat to be transported to the current rails without disturbing the temperature sensors 840. In other words, the temperature sensors 840 should also be placed as far away as possible from such heat sources.

Finally, FIG. 22 shows a perspective view of the multiple current sensor device 800 according to an embodiment comprising the mold compound 920 covering the die 830 (not shown in FIG. 22). The further contact between the resistive sections 110-1, 110-2, respectively, and their associated temperature sensors 840 on the die 830 is made via the previously mentioned underfill. Additionally or alternatively, the heat contact can also be established by additional bumps as outlined before. For this purpose, it might be a good choice to place the temperature sensors 840 exactly underneath the respective bumps for good thermal contact as outlined before.

In the FIG. 19-22, the leadframe 860 is shown as a half etched leadframe 860, where the resistive sections 110-1, 110-2 are thinner than the connecting sections 120-1, 120-2 and the common connecting section 130. However, it is also possible to use thick resistive portions 110. In this case, it might advisable to attach some anti-solder resist on the bottom of the leadframe 860 to avoid solder from spilling between the connecting sections 120-1, 120-2 and the common connecting section 130.

As outlined before, a multiple current shunt device 100 and a multiple current sensor device 800 according to embodiments may comprise a double current shunt with two resistive sections 110 that are coupled by one low Ohmic portion and a common connecting section 130 and two connecting sections 120. Thereby, a first connecting section 120-1 is coupled to a first resistive section 110-1, and a second connecting section 120-2 is coupled to a second resistive section 110-2. Both resistive sections 110-1, 110-2, which are also referred to as resistive portions, are further coupled to a common third contact, the common connecting section 130.

The connecting sections 120 and the common connecting section 130 may differ from the respective resistive sections 110 in so far as a voltage drop across the connecting sections 120 and the common connecting section 130 may be smaller, or even significantly smaller than a corresponding voltage drop across one of the resistive sections 110. A significantly smaller voltage drop may be present when the respective voltage drop across a resistive section 110 is larger than a factor of 2 or more compared to the corresponding voltage drop across any of the previously mentioned connecting sections 120, 130.

To implement a compact design, the two resistive sections 110-1, 110-2 may be arranged like branches of a U. As a consequence, it might be possible to implement a very compact device 100, 800.

The sense potentials may be tapped near the two corners of the connecting sections 120 and face each other. The common and ground sense potential may be tapped near the two corners of the resistive sections 110-1, 110-2, which are closest to the common connecting section 130.

For instance, the connecting sections 120-1, 120-2 along with the resistive sections 110-1, 110-2 may be equally large, but in special cases may also be chosen to be different, for instance, when the two currents I15 are I15' are different.

The resistive sections 110 may be fabricated or made up of alloys that may have a small or negligible temperature dependence of resistivity. Alternatively, they can be made of a good conductor, for instance, like pure copper (Cu) with reduced dimensions in terms of its cross section compared to the connecting sections 120.

In case the resistive sections 110 are made from an alloy with non-negligible temperature dependence of resistivity, it might be advisable to implement at least one temperature sensor 840 installed and arranged to be in intimate thermal contact with the resistive sections 110 to measure their temperatures and estimate the change of their resistivity due to a change of temperature.

If, however, the sensor circuit for measuring temperature and voltage across the resistive sections 110-1, 110-2 is attached to these parts, it might be advisable to connect any of the common connecting section 130, the resistive sections 110 and the connecting sections 120 with a ground pin or land of the sensor circuit by a part of the leadframe 860 (e.g. electrically conducting connection 980) or by a dedicated bond wire 890 or a ball 1040 to protect the evaluation circuit 810 from electrostatic discharges.

If, however, the sensor circuit for measuring temperature and voltage across the resistive sections 110 is attached to these parts, it might be advisable to connect the ground pad of the sensor die 830 to parts of the current rails (connecting sections 120, resistive sections 110, common connecting section 130), to skip a dedicated ground pin or land. This may, for instance, be especially advisable in the case of a common connecting section 130.

FIG. 23 shows a flow chart of a method for providing a sensor signal, which may, for instance, be carried out using a multiple current sensor device 800 according to an embodiment. The method comprises providing S200 a first current comprising magnitude corresponding to a first part of a combined current to a discrete sensor device. Similarly and, optionally, simultaneously, a second current comprising a magnitude corresponding to a second part of the combined current is provided S210 to the discrete sensor device. However, the two currents may also be provided to the device sequentially or overlapping in time. An order, how the two currents are provided to the device 800, is, however, not limited to the order as indicated by the flow chart of FIG. 23.

Depending on the direction of the first and second currents, the first current and the second current may either be combined to form the combined current or the combined current may be split up into the first and second currents. Optionally, this may be performed inside the discrete sensor device. For instance, the discrete multiple device may be optionally a multiple current sensor device 800 according to an embodiment. To facilitate this, the device may comprise at least a first current rail and a second current rail such that the first current is provided (S200) to the first current rail and the second current being provided (S210) to the second current rail. Naturally, in the case of employing a multiple current sensor device 800 according to an embodiment, the first and second current rails 135 may share a common connecting section 130 configured to electrically couple the device to an external current or signal line, for instance a current trace of a PCB, as described before.

The method further comprises providing S230 a sensor signal comprising information concerning the magnitudes of the first current and of the second current.

However, instead of using a multiple current sensor device 800 according to an embodiment as the sensor device, a sensor device 1100 as shown in FIG. 24 may be used. FIG. 24 shows a schematic view of a printed circuit board 600 comprising such a sensor device 1100. The sensor device 1100 is once again implemented as a discrete device comprises a plurality of current paths or current rails 135. To be a little bit more specific, the sensor device 1100 shown in FIG. 24 comprises a first current rail 135-1 and a second current rail 135-2, which integrated into the sensor device 1100, but which are galvanically isolated from one another inside the sensor device 100. However, the first and second current rails 135-1, 135-2 are both electrically coupled to a common current trace 620. Moreover, the first and second current rails 135-1, 135-2 are electrically coupled to a first current trace 610-1 and a second current trace 610-2, respectively. The sensor device 1100 further comprises an evaluation circuit 810, which is configured to determine voltage drops across the current rails 135 and to provide a sensor signal comprising information based on the determined voltages concerning a magnitude of the currents flowing through the current rails 135. In other words, the evaluation circuit 810, implemented on its die 820, is configured to measure the magnitudes of the currents flowing through the current rails 135.

This solution may also provide the opportunity of reducing a spread between the individual current rails 135, since they can be fabricated from at same time. The thermal, inductive, mechanical and electrical coupling of the current rails 135 may be well defined and may be stable over the life of the sensor device 1100.

Moreover, it may be possible to save energy and infrastructure to couple a second chip. The evaluation circuit 810 may, for instance, be provided with a ground or reference potential by coupling same to the common current trace 620 on the printed circuit board 600. This may be possible, when, for instance, typical voltages applied to the sensor device 1100 are not too high, e.g. not exceeding 100 V. However, this may lead to a less effective protection against electrostatic discharges.

Depending on the direction of the first current provided to the first current rail 135-1 and the second current provided to the second current rail 135-2, the two currents are combined to form the common current or split up from the common current to form the two individual currents on the PCB 600 here. Optionally, this may also be done inside the sensor device 1100 when implemented, for instance, as an embodiment of a multiple current sensor device 800.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A discrete multiple current sensor device comprising:
an evaluation circuit; and
at least a first current rail and a second current rail, the first current rail and the second current rail comprising a common connecting section,
the first current rail further comprising a first resistive section and a first connecting section such that the first resistive section is electrically coupled in between the first connecting section and the common connecting section,
the second current rail further comprising a second resistive section and a second connecting section such that the second resistive section is electrically coupled in between the second connecting section and the common connecting section,
wherein the evaluation circuit is configured to determine at least one voltage drop across one of the at least two resistive sections and to provide a sensor signal indicative of at least one current value of a current flowing through the respective resistive section based on the at least one determined voltage drop, and
wherein the evaluation circuit is configured to determine at least two voltage drops across the at least two resistive sections comprising a first voltage drop and a second voltage drop, the discrete current sensor device further comprising at least one terminal coupled to the evaluation circuit, wherein the evaluation circuit and the at least one terminal are configured to perform at least two operations of a group of operations, wherein the group of operations comprises supplying the evaluation circuit with a reference potential, supplying the evaluation circuit with a supply signal, receiving a control signal, providing an information carrying signal indicative of or based on the first determined voltage drop, providing an information carrying signal indicative of or based on the second determined voltage drop and receiving an information carrying signal.

2. The discrete multiple current sensor device according to claim 1, wherein the evaluation circuit comprises at least one semiconductor die, which is mechanically, electrically and thermally coupled to at least one of the first current rail and the second current rail.

3. The discrete multiple current sensor device according to claim 2, comprising a plane die attach surface, onto which the die of the evaluation circuit is attached, wherein the die attach surface is at least partially formed by at least a part of a surface of the first current rail or of the second current rail.

4. The discrete multiple current sensor device according to claim 3, wherein the evaluation circuit comprises at least one temperature sensor, wherein temperature sensor is configured to provide a signal comprising information on at least one temperature value, and wherein the evaluation circuit is further configured to provide the sensor signal indicative of the at least one current value based on the information from the temperature sensor.

5. The discrete multiple current sensor device according to claim 4, wherein the evaluation circuit comprises for each of the at least two resistive sections at least one temperature sensor associated to each one of the at least two resistive sections.

6. The discrete multiple current sensor device according to claim 4, wherein at least one of the at least two resistive sections and at least one of the common connecting section and the at least one of the at least two connecting sections are fabricated from an essentially identical material, and wherein at least one of the at least two resistive sections comprises at least one of a smaller thickness perpendicular to the die attach surface and a smaller width in a plane parallel to the die attach surface than the connecting section electrically coupled to the respective resistive section.

7. The discrete multiple current sensor device according to claim 6, wherein the multiple current sensor device comprises a leadframe, and wherein the at least two resistive sections, the at least two connecting sections and the common connecting section are part of the leadframe.

8. The discrete multiple current sensor device according to claim 3, wherein the evaluation circuit is electrically coupled to the at least two resistive sections in at least one connecting area by at least one electrical connection leaving the die of the evaluation circuit, wherein the at least one connecting area is a projection area of a coupling area of the multiple current sensor device along a projection direction perpendicular to a plane comprising the first resistive section and the second resistive section, the coupling area being configured to couple the multiple current sensor device electrically to a current trace, or wherein the at least one connecting area is a projection area of the at least one resistive section and the at least one connecting section.

9. The discrete multiple current sensor device according to claim 8, wherein the evaluation circuit is electrically coupled to the at least two resistive sections in square sub-regions of the connecting areas completely comprised in the connecting areas, the square sub-regions having a width of at most 50% of a smallest characteristic length of the connecting area parallel to the die attach surface.

10. The discrete multiple current sensor device according to claim 3, wherein the die of the evaluation circuit is at least partially mounted on the die attach surface using a flip-chip mounting style.

11. The discrete multiple current sensor device according to claim 1, wherein the first current rail and the second current rail are together essentially U-shaped.

12. The discrete multiple current sensor device according to claim 1, wherein at least one of the at least two resistive sections comprises a material with a smaller variation of the electrical resistivity with temperature than a material of at least one of the at least two connecting sections and the common connecting section.

13. The discrete multiple current sensor device according to claim 1, wherein the evaluation circuit comprises at least one electrostatic discharge protective circuit configured to protect the evaluation circuit from a damage due to an electrostatic discharge.

14. The discrete multiple current sensor device according to claim 13, wherein the electrostatic discharge protective circuit comprises at least one of at least one electrostatic discharge protective diode and an electrically conductive connection of a terminal of the multiple current sensor device and at least one of the at least two resistive sections, the at least two connecting sections and the common connecting section.

15. A multiple current shunt device comprising:
at least two resistive sections comprising a first resistive section and a second resistive section;
at least two connecting sections comprising a first connecting section and a second connecting section; and
a common connecting section,
wherein the first resistive section is electrically coupled in between the first connecting section and the common connecting section;
wherein the second resistive section is electrically coupled in between the second connecting section and the common connecting section; and
wherein at least one of the at least two resistive sections comprises a material with a smaller variation of the electrical resistivity with temperature than a material of at least one of the at least two connecting sections and the common connecting section,
wherein a die comprising an evaluation circuit is arranged on a plane die attach surface, wherein at least one of the at least two resistive sections, the at least two connecting sections and the common connecting section form the plane die attach surface.

16. The multiple current shunt device according to claim 15, wherein the common connecting section and the at least two connecting sections are configured to be directly mountable onto a printed circuit board.

17. The multiple current shunt device according to claim 15, wherein the materials of the at least two resistive sections are essentially identical and wherein the materials of the at least two connecting sections are essentially identical.

18. The multiple current shunt device according to claim 15, wherein the multiple current shunt device is designed such that a reference plane exists, which intersects all of the at least two resistive sections, and wherein the electrical contacts between all of the at least two connecting sections and the respective resistive sections are completely arranged in one half space on one side of the reference plane and wherein the electrical contacts between the common connecting section and all of the at least two resistive sections are completely arranged in the other half space on the other side of the reference plane.

19. The multiple current shunt device according to claim 15, wherein the die comprising the evaluating circuit is electrically connected to the at least two connecting sections and the common connecting section by bond wires.

20. A double current sensor device comprising:
an evaluation circuit; and
a first current rail and a second current rail, the first current rail and the second current rail comprising a common connecting section,
the first current rail further comprising a first resistive section and a first connecting section such that the first resistive section is electrically coupled in between the first connecting section and the common connecting section, the second current rail further comprising a second resistive section and a second connecting section such that the second resistive section is electrically coupled in between the second connecting section and the common connecting section, wherein the evaluation circuit is configured to determine at least one voltage drop across one of the at least two resistive sections and to provide a sensor signal indicative of at least one current value of a current flowing through the respective resistive section based on the at least one determined voltage drop;

wherein a die of the evaluation circuit is at least partially mounted on a die attach surface using a flip-chip mounting style;

wherein the die attach surface is at least partially formed by at least a part of a surface of the first current rail or of the second current rail, and wherein the evaluation circuit is configured to determine at least two voltage drops across the at least two resistive sections comprising a first voltage drop and a second voltage drop, the double current sensor device further comprising at least one terminal coupled to the evaluation circuit, wherein the evaluation circuit and the at least one terminal are configured to perform at least two operations of a group of operations, wherein the group of operations comprises supplying the evaluation circuit with a reference potential, supplying the evaluation circuit with a supply signal, receiving a control signal, providing an information carrying signal indicative of or based on the first determined voltage drop, providing an information carrying signal indicative of or based on the second determined voltage drop and receiving an information carrying signal.

21. A method for providing a sensor signal, comprising: providing a discrete sensor device, comprising:
an evaluation circuit; and
at least a first current rail and a second current rail, the first current rail and the second current rail comprising a common connecting section, the first current rail further comprising a first resistive section and a first connecting section such that the first resistive section is electrically coupled in between the first connecting section and the common connecting section, the second current rail further comprising a second resistive section and a second connecting section such that the second resistive section is electrically coupled in between the second connecting section and the common connecting section, providing a first current comprising a magnitude the first connecting section of the discrete sensor device;

providing a second current comprising a magnitude to the second connecting section of the discrete sensor device;

providing a sensor signal comprising information concerning the magnitudes of the first current and of the second current using the evaluation circuit, wherein the evaluation circuit is configured to determine at least two voltage drops across the at least two resistive sections comprising a first voltage drop and a second voltage drop, the discrete current sensor device further comprising at least one terminal coupled to the evaluation circuit, wherein the evaluation circuit and the at least one terminal are configured to perform at least two operations of a group of operations, wherein the group of operations comprises supplying the evaluation circuit with a reference potential, supplying the evaluation circuit with a supply signal, receiving a control signal, providing an information carrying signal indicative of or based on the first determined voltage drop, providing an information carrying signal indicative of or based on the second determined voltage drop and receiving an information carrying signal.

22. The method of claim 21, wherein the first current and the second current are simultaneously provided to the discrete multiple current sensor device.

* * * * *